United States Patent
Jang et al.

(10) Patent No.: US 10,978,499 B2
(45) Date of Patent: Apr. 13, 2021

(54) DISPLAY APPARATUS COMPRISING DIFFERENT TYPES OF THIN FILM TRANSISTORS AND METHOD FOR MANUFACTURING THE SAME

(71) Applicant: LG Display Co., Ltd., Seoul (KR)

(72) Inventors: Jaeman Jang, Paju-si (KR); SeHee Park, Paju-si (KR); DaeHwan Kim, Paju-si (KR); PilSang Yun, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/525,482

(22) Filed: Jul. 29, 2019

(65) Prior Publication Data

US 2020/0212077 A1    Jul. 2, 2020

(30) Foreign Application Priority Data

Dec. 26, 2018  (KR) ......... 10-2018-0169569

(51) Int. Cl.
*H01L 27/12* (2006.01)
*H01L 27/32* (2006.01)

(52) U.S. Cl.
CPC ...... *H01L 27/1255* (2013.01); *H01L 27/1225* (2013.01); *H01L 27/1251* (2013.01); *H01L 27/3262* (2013.01)

(58) Field of Classification Search
None
See application file for complete search history.

(56) References Cited

U.S. PATENT DOCUMENTS

| 2008/0116457 | A1* | 5/2008 | Park | H01L 29/04 257/59 |
| 2015/0333089 | A1* | 11/2015 | Yamazaki | H01L 29/78693 257/43 |
| 2018/0175127 | A1* | 6/2018 | Lee | H01L 27/3276 |

FOREIGN PATENT DOCUMENTS

| KR | 10-2015-0100566 A | 9/2015 |
| KR | 10-2016-0056650 A | 5/2016 |
| KR | 10-2016-0150199 A | 12/2016 |

* cited by examiner

*Primary Examiner* — Daniel Whalen
(74) *Attorney, Agent, or Firm* — Polsinelli PC

(57) ABSTRACT

A display apparatus includes a substrate; a pixel driving circuit on the substrate; and a display unit connected with the pixel driving circuit, wherein the pixel driving circuit includes a first thin film transistor and a second thin film transistor, wherein the first thin film transistor includes, a first gate electrode on the substrate, a first active layer spaced apart from the first gate electrode and overlapping at least a part of the first gate electrode, a first source electrode connected with the first active layer; and a first drain electrode spaced apart from the first source electrode and connected with the first active layer, and wherein the second thin film transistor includes, a second active layer on the substrate, and a second gate electrode spaced apart from the second active layer and partially overlapping at least a part of the second active layer, wherein the first gate electrode is disposed between the substrate and the first active layer, the second active layer is disposed between the substrate and the second gate electrode, and the first gate electrode and the second gate electrode are disposed at an opposite side with respect to the second active layer.

14 Claims, 20 Drawing Sheets

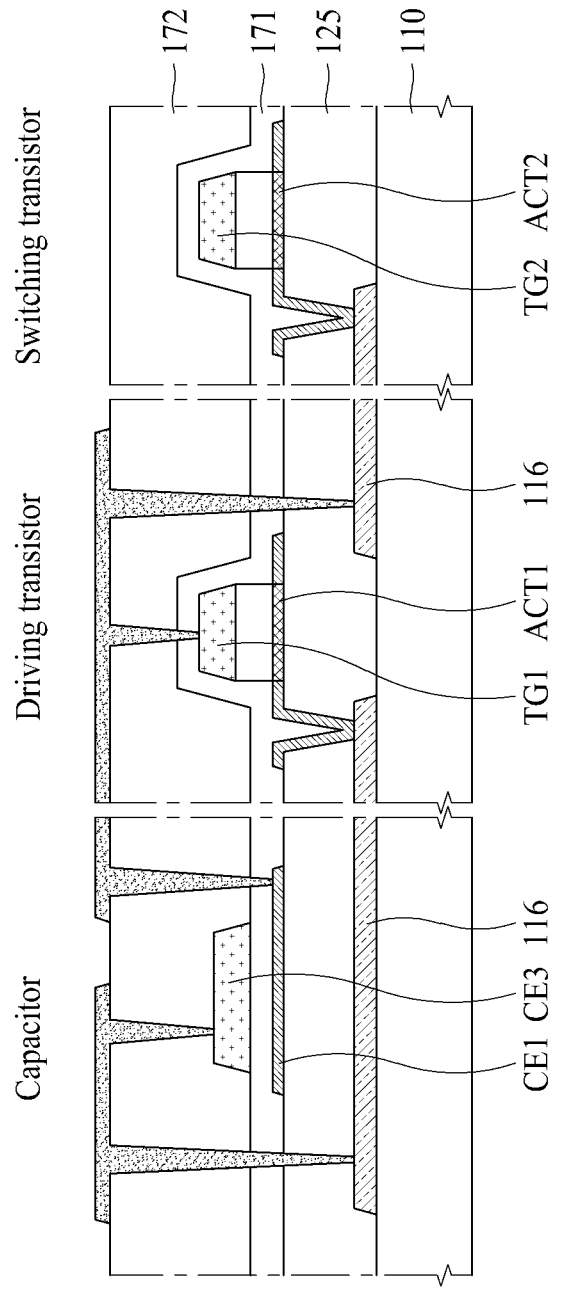

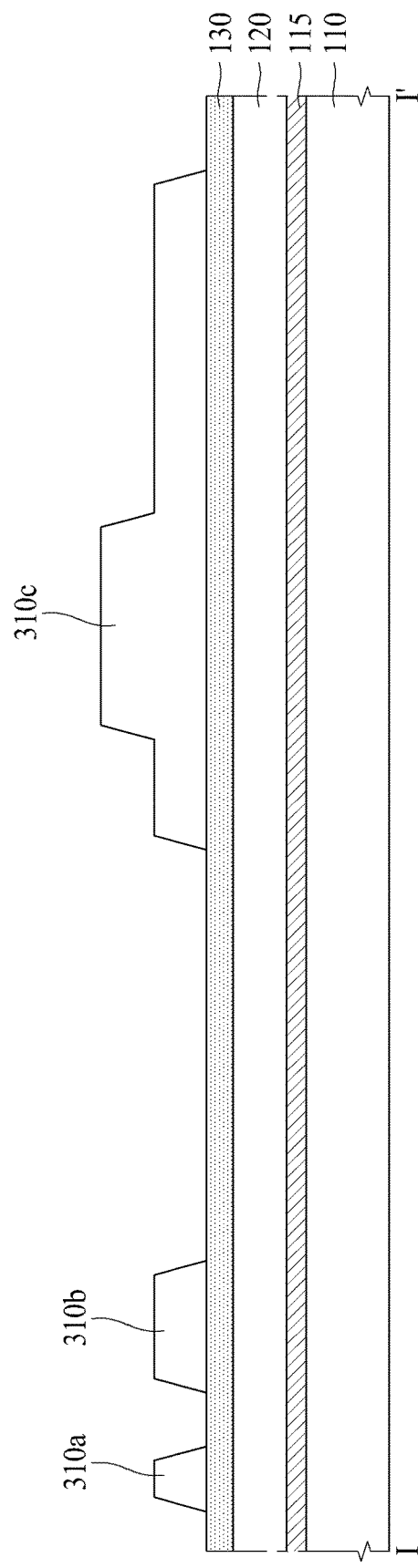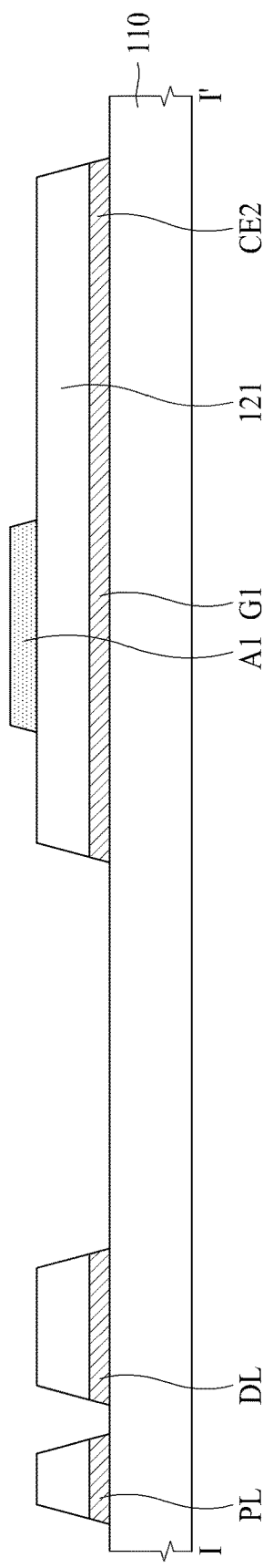

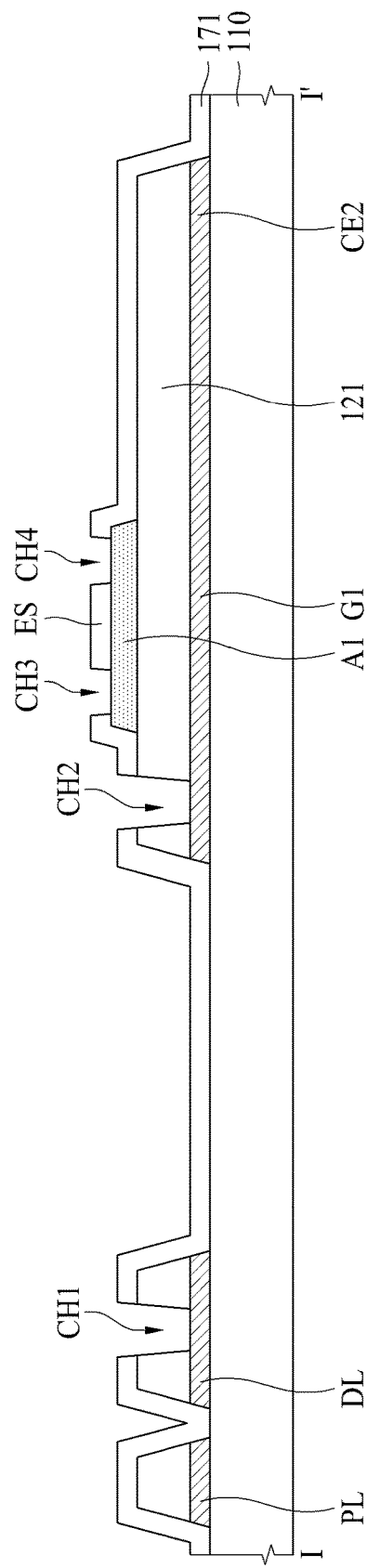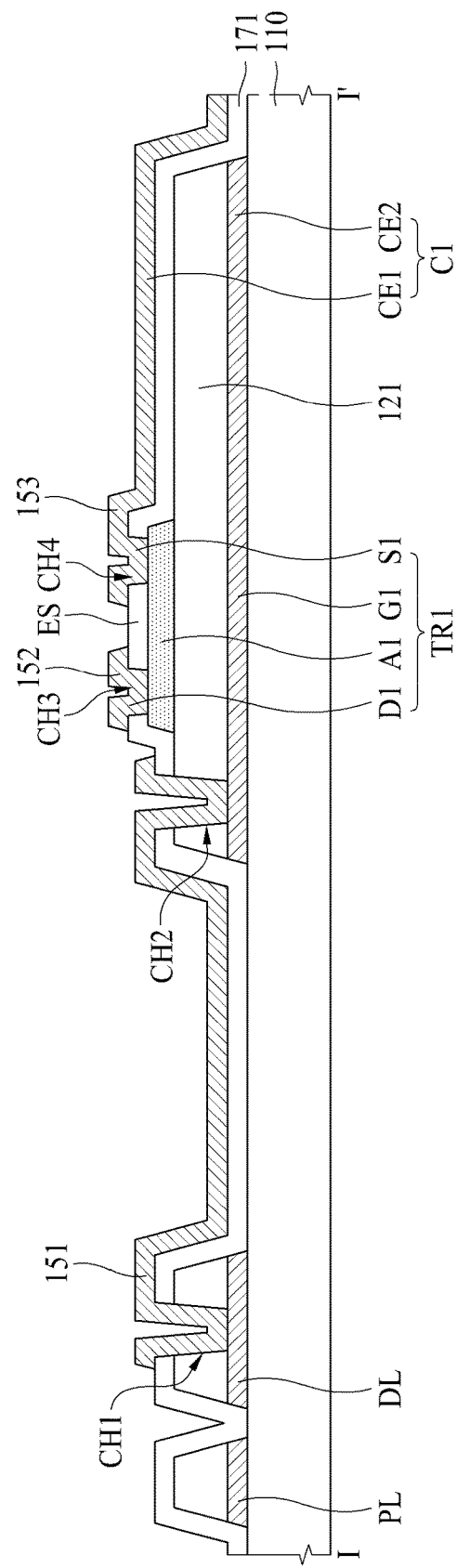

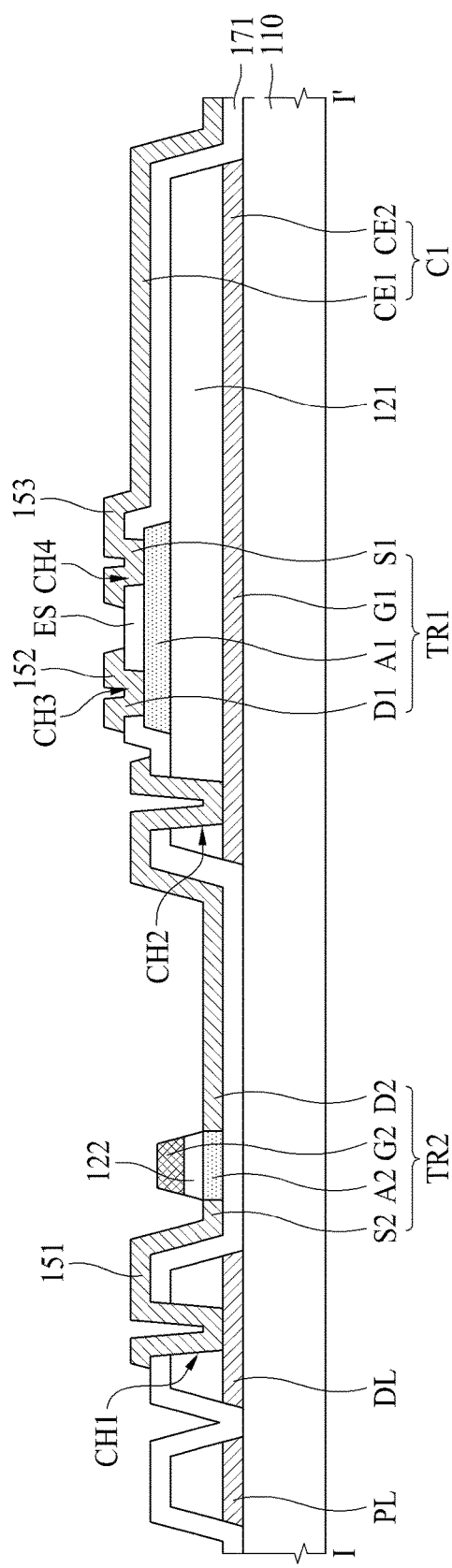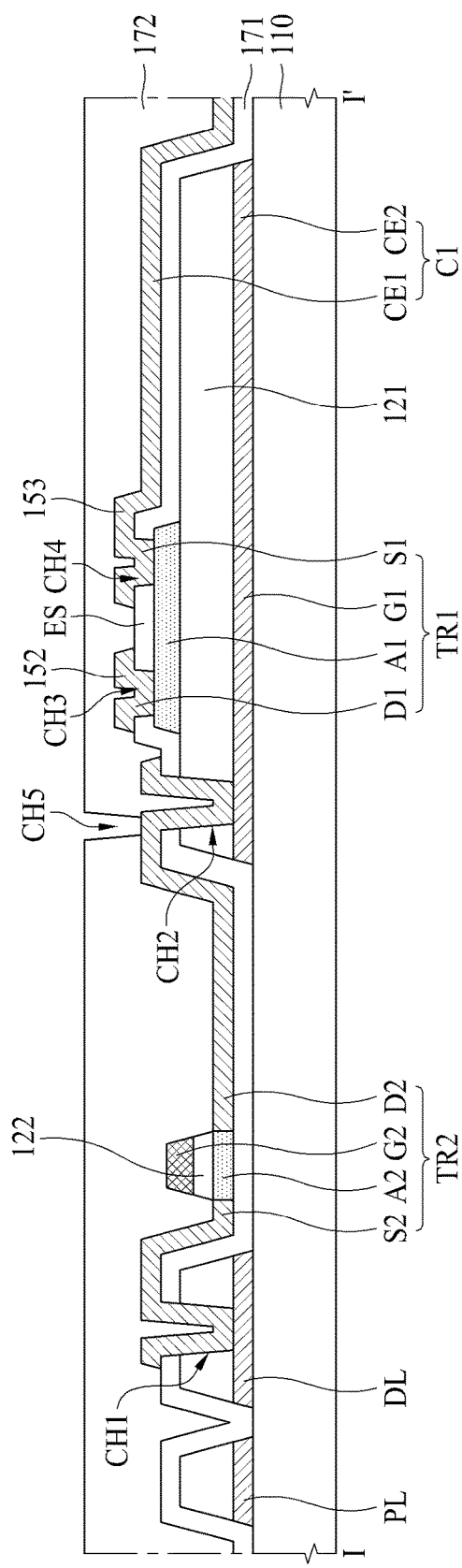

DISPLAY APPARATUS COMPRISING DIFFERENT TYPES OF THIN FILM TRANSISTORS AND METHOD FOR MANUFACTURING THE SAME

CROSS-REFERENCE TO RELATED APPLICATION

This application claims the priority of the Korean Patent Application No. 10-2018-0169569 filed on Dec. 26, 2018, which is hereby incorporated by reference in its entirety as if fully set forth herein.

BACKGROUND

Field of the Disclosure

The present disclosure relates to a display apparatus, and more particularly, to a display apparatus comprising different types of thin film transistors and a method for manufacturing the same. Although the present disclosure is suitable for a wide scope of applications, it is particularly suitable for securing a sufficient capacitor area when a plurality of thin film transistors is required to be arranged in the display apparatus, and a method for manufacturing the same.

Description of the Background

A thin film transistor can be manufactured on a glass substrate or a plastic substrate, thus the thin film transistor has been widely used as a switching device or a driving device in a display device such as a liquid crystal display device or an organic light emitting device.

Depending on a material used for an active layer, the thin film transistor may be largely categorized into an amorphous silicon thin film transistor having an active layer of amorphous silicon, a polycrystalline silicon thin film transistor having an active layer of polycrystalline silicon, and an oxide semiconductor thin film transistor having an active layer of oxide semiconductor.

The amorphous silicon can be deposited in a short time as an active layer, thus the amorphous silicon thin film transistor (i.e., a-Si TFT) has advantages of short manufacturing time and low manufacturing cost. Meanwhile, it has disadvantages of inferior current driving efficiency due to low mobility, and a change of a threshold voltage. Thus, it is difficult to use the amorphous silicon thin film transistor for an active matrix organic light emitting device (AMOLED).

The polycrystalline silicon thin film transistor (poly-Si TFT) can be obtained by depositing amorphous silicon and crystallizing the deposited amorphous silicon. The polycrystalline silicon thin film transistor has advantages of high electron mobility and great stability, realization of thin profile and high resolution, and high power efficiency, etc. The polycrystalline silicon thin film transistor may include a low temperature poly silicon (LTPS) thin film transistor, or a polysilicon thin film transistor. However, a process of manufacturing the polycrystalline silicon thin film transistor inevitably needs a step of crystallizing the amorphous silicon. As a result, a manufacturing cost can be increased due to the increased number of manufacturing steps. Also, it has a disadvantage of crystallization at a high temperature. Thus, it is difficult to apply the polycrystalline silicon thin film transistor to a large-sized display apparatus.

The oxide semiconductor thin film transistor (oxide semiconductor TFT), which has high mobility and has a large resistance change in accordance with an oxygen content, is advantageous in that desired properties can be readily obtained. Also, an active layer of oxide is formed at a relatively low temperature for a process of manufacturing the oxide semiconductor thin film transistor, thus it is possible to lower a manufacturing cost. Also, owing to the properties of oxide, an oxide semiconductor is transparent, it is favorable to realization of a transparent display apparatus. However, in comparison to the polycrystalline silicon thin film transistor, the oxide semiconductor thin film transistor has relatively low stability and electron mobility.

Recently, with an advancement of high quality and high resolution in a display device, a thin film transistor is integrated at a high density in the display apparatus. As a result, a large number of thin film transistors are arranged in a limited area, and a large number of contact holes are formed so that it is difficult to secure an enough capacitor area. Thus, it needs a method for securing a capacitor area in a display apparatus comprising a large number of thin film transistors.

SUMMARY

The present disclosure has been made in view of the above problems and is to provide a display apparatus which facilitates to secure a sufficient capacitor area even in case of arranging a plurality of thin film transistors, and a method for manufacturing the same.

Also, the present disclosure is to provide a display apparatus which facilitates to secure a sufficient capacitor area by decreasing the number of contact holes for an electrical connection of thin film transistor even in case of arranging a plurality of thin film transistors, and a method for manufacturing the same.

Further, the present disclosure is to provide a method for manufacturing a display apparatus which facilitates to decrease the number of patterning processes, and a display apparatus manufactured by the same method.

In accordance with an aspect of the present disclosure, the above and other aspects can be accomplished by the provision of a display apparatus comprising a substrate, a pixel driving circuit on the substrate, and a display unit connected with the pixel driving circuit, wherein the pixel driving circuit includes a first thin film transistor and a second thin film transistor, wherein the first thin film transistor includes a first gate electrode on the substrate, a first active layer configured to be spaced from the first gate electrode and to be overlapped with at least a part of the first gate electrode, a first source electrode connected with the first active layer, and a first drain electrode configured to be spaced from the first source electrode and to be connected with the first active layer, and wherein the second thin film transistor includes a second active layer on the substrate, and a second gate electrode configured to be spaced from the second active layer and to be overlapped with at least a part of the second active layer, the first gate electrode is disposed between the substrate and the first active layer, and the second active layer is disposed between the substrate and the second gate electrode.

With respect to the second active layer, the first gate electrode and the second gate electrode are disposed at opposite layers.

The second active layer is disposed in the same layer as the first source electrode and the first drain electrode.

The display apparatus further includes a first insulating interlayer on the first active layer, wherein the first source electrode and the first drain electrode are disposed on the first insulating interlayer and are connected with the first active layer through contact holes.

The display apparatus further includes an etch stopper on the first active layer.

The etch stopper is disposed in the same layer as the first insulating interlayer.

The etch stopper is formed of the same material as that of the first insulating interlayer.

The second active layer is disposed on the first insulating interlayer.

The second active layer is formed of an oxide semiconductor material, and the first source electrode and the first drain electrode are formed of the same oxide semiconductor material as that of the second active layer.

At least one of the first active layer and the second active layer includes a first oxide semiconductor layer and a second oxide semiconductor layer on the first oxide semiconductor layer.

The display apparatus further includes a data line and a driving voltage line, wherein the data line and the driving voltage line are disposed in the same layer as the first gate electrode.

The display apparatus further includes a second insulating interlayer on the first source electrode and the first drain electrode, and a planarization layer on the second insulating interlayer, wherein the display unit is disposed on the planarization layer.

The display unit includes a first electrode on the planarization layer, wherein the first electrode is connected with any one of the first source electrode and the first drain electrode through a contact hole provided in the second insulating layer and the planarization layer.

The display apparatus further includes a storage capacitor connected with the first thin film transistor, wherein the storage capacitor includes a first capacitor electrode formed as one body with the first source electrode, and a second capacitor electrode formed as one body with the first gate electrode.

The storage capacitor further includes a third capacitor electrode configured to be spaced from the first capacitor electrode and to be disposed on the second insulating interlayer.

The first thin film transistor may function as a driving transistor for driving the display unit. The second thin film transistor may function as a switching transistor.

In accordance with another aspect of the present disclosure, there is provided a method for manufacturing a display apparatus including sequentially depositing a first conductive material layer, a first insulating material layer and a first active material layer on a substrate; forming a first gate electrode from the first conductive material layer, a first gate insulating film from the first insulating material, and a first active layer from the first active material by a selective etching process; forming a first insulating interlayer on the first active layer; forming a second active material layer including a plurality of patterns on the first insulating interlayer; forming a second gate insulating film and a second gate electrode on at least a part of the second active material layer; and conductivizing the second active material layer in the area that does not overlap the second gate electrode.

In accordance with a further aspect of the present disclosure, there is provided a pixel driving circuit for a display apparatus comprising a first gate electrode on a substrate; a first active layer spaced apart from the first gate electrode and overlapping at least a part of the first gate electrode; a first source electrode connected with the first active layer; a first drain electrode spaced apart from the first source electrode and connected with the first active layer; a second active layer on the substrate; and a second gate electrode spaced apart from the second active layer and overlapping at least a part of the second active layer, wherein the first gate electrode, the first active layer and the first source/drain electrodes constitute a driving transistor of the pixel driving circuit, and the second gate electrode, the second active layer and the second source/drain electrodes constitute a switching transistor of the pixel driving circuit, and wherein the first gate electrode is disposed between the substrate and the first active layer, the second active layer is disposed between the substrate and the second gate electrode, and the first gate electrode and the second gate electrode are disposed at an opposite side with respect to the second active layer.

A first source electrode and a first drain electrode are formed while being spaced from each other and being connected with the first active layer in the conductivizing process.

An etch stopper is provided between the first source electrode and the second source electrode.

The etch stopper is formed of the same material as that of the first insulating interlayer.

A part of the first source electrode and a part of the first gate electrode, which are overlapped with each other, form the storage capacitor.

The method further includes forming a second insulating interlayer on the first source electrode, and forming a third capacitor electrode being overlapped with at least a part of the first source electrode on the second insulating interlayer.

According to one aspect of the present disclosure, the thin film transistor of the bottom gate type is used together with the thin film transistor of the top gate type in the display apparatus so that it is possible to sufficiently secure the capacitor area in the display apparatus.

According to another aspect of the present disclosure, the thin film transistor of the bottom gate type is used together with the thin film transistor of the top gate type in the display apparatus so that it is possible to reduce the number of contact holes used for the electrical connection of the thin film transistor. As a result, it is possible to sufficiently secure the capacitor area in the display apparatus.

According to another aspect of the present disclosure, the thin film transistor of the bottom gate type is used together with the thin film transistor of the top gate type in the display apparatus so that the number of patterning processes is reduced, thus it is possible to simplify a manufacturing process and to reduce a manufacturing cost.

In addition to the effects of the present disclosure as mentioned above, additional advantages and features of the present disclosure will be clearly understood by those skilled in the art from the description of the present disclosure.

BRIEF DESCRIPTION

The above and other aspects, features and other advantages of the present disclosure will be more clearly understood from the following detailed description taken in conjunction with the accompanying drawings, in which:

FIG. 6B is a cross sectional view illustrating a storage capacitor, a driving transistor and a switching transistor included in a display apparatus according to the related art;

FIGS. 9A, 9B, 9C, 9D, 9E, 9F, 9G, 9H and 9I are cross-sectional views illustrating a method for manufacturing a display apparatus according to one aspects of the present disclosure;

DETAILED DESCRIPTION

Figure 1:
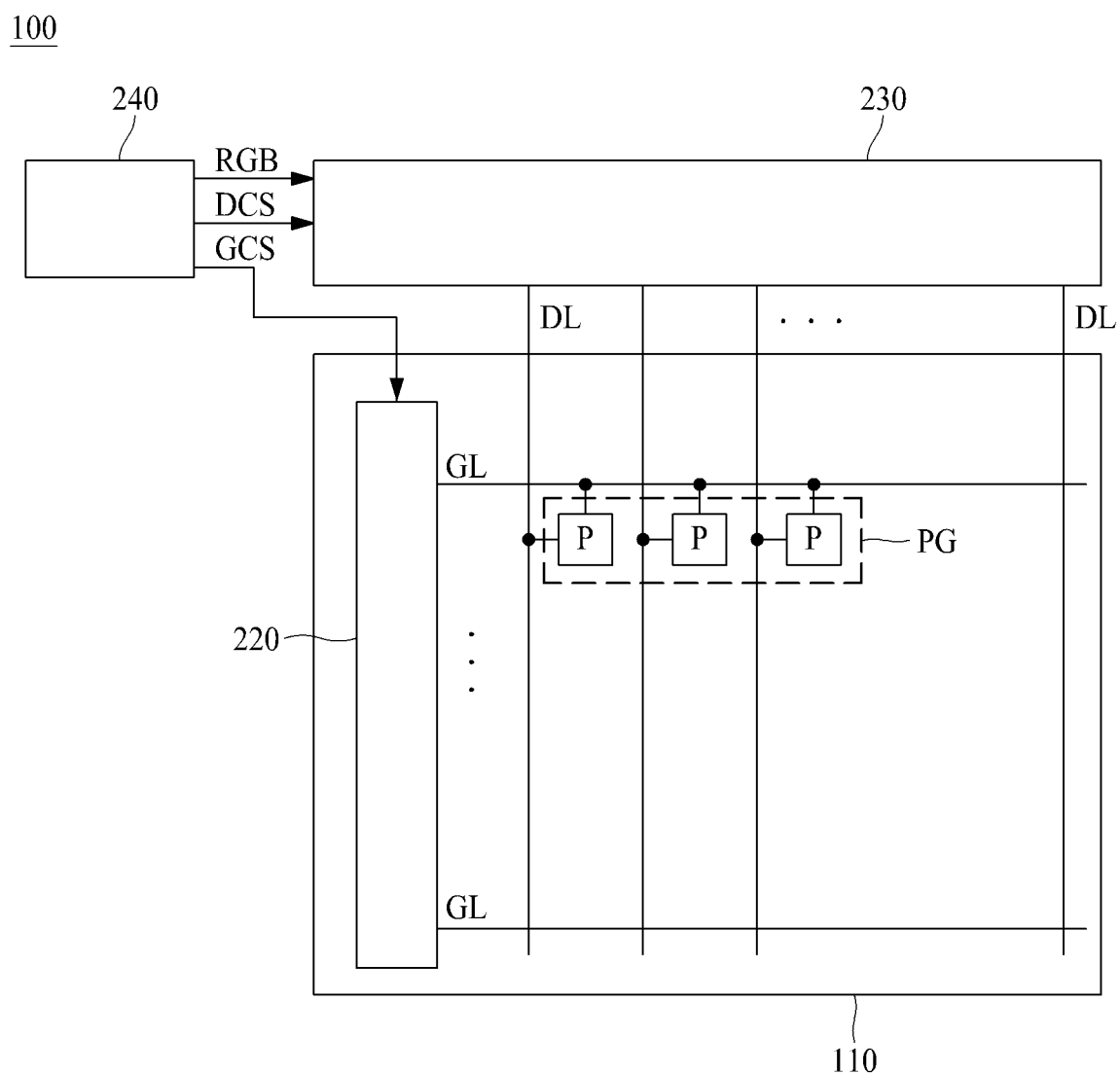
FIG. 1 is a schematic view illustrating a display apparatus according to one aspect of the present disclosure.

Advantages and features of the present disclosure, and implementation methods thereof will be clarified through the following aspects, described with reference to the accompanying drawings. The present disclosure may, however, be embodied in different forms and should not be construed as being limited to the aspects set forth herein. Rather, these aspects are provided so that this disclosure will be thorough and complete, and will fully convey the scope of the present disclosure to those skilled in the art. Further, the present disclosure is only defined by the scope of the claims.

The shapes, sizes, ratios, angles, and numbers disclosed in the drawings for describing aspects of the present disclosure are merely examples, and thus the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In the case in which "comprise," "have," and "include" described in the present specification are used, another part may also be present unless "only" is used. The terms in a singular form may include plural forms unless noted to the contrary.

In construing an element, the element is construed as including an error region although there is no explicit description thereof.

In describing a positional relationship, for example, when the positional order is described as "on," "above," "below," "beneath", and "next," the case of no contact therebetween may be included, unless "just" or "direct" is used. If it is mentioned that a first element is positioned "on" a second element, it does not mean that the first element is essentially positioned above the second element in the figure. The upper part and the lower part of an object concerned may be changed depending on the orientation of the object. Consequently, the case in which a first element is positioned "on" a second element includes the case in which the first element is positioned "below" the second element as well as the case in which the first element is positioned "above" the second element in the figure or in an actual configuration.

In describing a temporal relationship, for example, when the temporal order is described as "after," "subsequent," "next," and "before," a case which is not continuous may be included, unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The terms "first horizontal axis direction," "second horizontal axis direction," and "vertical axis direction" should not be interpreted only based on a geometrical relationship in which the respective directions are perpendicular to each other, and may be meant as directions having wider directivities within the range within which the components of the present disclosure can operate functionally.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in a co-dependent relationship.

In the drawings, the same or similar elements are denoted by the same reference numerals even though they are depicted in different drawings.

In the aspects of the present disclosure, a source electrode and a drain electrode are distinguished from each other, for convenience of explanation. However, the source electrode and the drain electrode are used interchangeably. Thus, the source electrode may be the drain electrode, and the drain electrode may be the source electrode. Also, the source electrode in any one aspect of the present disclosure may be the drain electrode in another aspect of the present disclosure, and the drain electrode in any one aspect of the present disclosure may be the source electrode in another aspect of the present disclosure.

In one or more aspects of the present disclosure, for convenience of explanation, a source region is distinguished from a source electrode, and a drain region is distinguished from a drain electrode. However, aspects of the present disclosure are not limited to this structure. For example, a source region may be a source electrode, and a drain region may be a drain electrode. Also, a source region may be a drain electrode, and a drain region may be a source electrode.

Hereinafter, a display apparatus 100 according to one aspect of the present disclosure will be described in detail with reference to FIGS. 1 to 5.

The display apparatus 100 according to one aspect of the present disclosure includes a substrate 100, a pixel driving circuit (PDC) on the substrate 110, and a display unit 710 connected with the pixel driving circuit (PDC). The pixel driving circuit (PDC) includes thin film transistors (TR1, TR2).

FIG. 1 is a schematic view illustrating the display apparatus 100 according to one aspect of the present disclosure.

As shown in FIG. 1, the display apparatus 100 according to one aspect of the present disclosure includes a pixel (P) on the substrate 110, a gate driver 220, a data driver 230, and a controller 240.

On the substrate 110, there are gate lines (GL) and data lines (DL), and the pixel (P) is arranged at a crossing portion of the gate line (GL) and the data line (DL). The pixel (P) includes the display unit 710, and the pixel driving circuit (PDC) for driving the display unit 710. An image is displayed by driving the pixel (P). The plurality of pixels (P) may constitute one pixel unit (PG).

The controller 240 controls the gate driver 220 and the data driver 230.

The controller 240 outputs a gate control signal (GCS) for controlling the gate driver 220 and a data control signal (DCS) for controlling the data driver 230 by the use of vertically/horizontally synchronized signal and clock signal supplied from an external system (not shown). Also, the controller 240 samples input video data, which is provided from the external system, and then re-aligns the sampled video data, and supplies the re-aligned digital video data (RGB) to the data driver 230.

The gate control signal (GCS) includes a gate start pulse (GSP), a gate shift clock (GSC), a gate output enable signal (GOE), a start signal (Vst), and a gate clock (GCLK). Also, control signals for controlling a shift register may be included in the gate control signal (GCS).

The data control signal (DCS) includes a source start pulse (SSP), a source shift clock signal (SSC), a source output enable signal (SOE), and a polarity control signal (POL).

The data driver 230 supplies a data voltage to the data lines (DL) on the substrate 110. In detail, the data driver 230 converts the video data (RGB) provided from the controller 240 into an analog data voltage, and supplies the analog data voltage to the data lines (DL).

The gate driver 220 sequentially supplies a gate pulse (GP) to the gate lines (GL) for 1 frame period. Herein, '1 frame' indicates the period in which one image is output through the display panel. Also, the gate driver 220 supplies a gate-off signal for turning off the switching device to the gate line (GL) for the remaining period of 1 frame in which the gate pulse (GP) is not supplied. Hereinafter, the gate pulse (GP) and the gate-off signal (Goff) are totally referred to as scan signals (SS).

According to one aspect of the present disclosure, the gate driver 220 may be provided on the substrate 110. A structure of directly providing the gate driver 220 on the substrate 110 may be referred to as Gate-In-Panel (GIP) structure.

Figure 2:
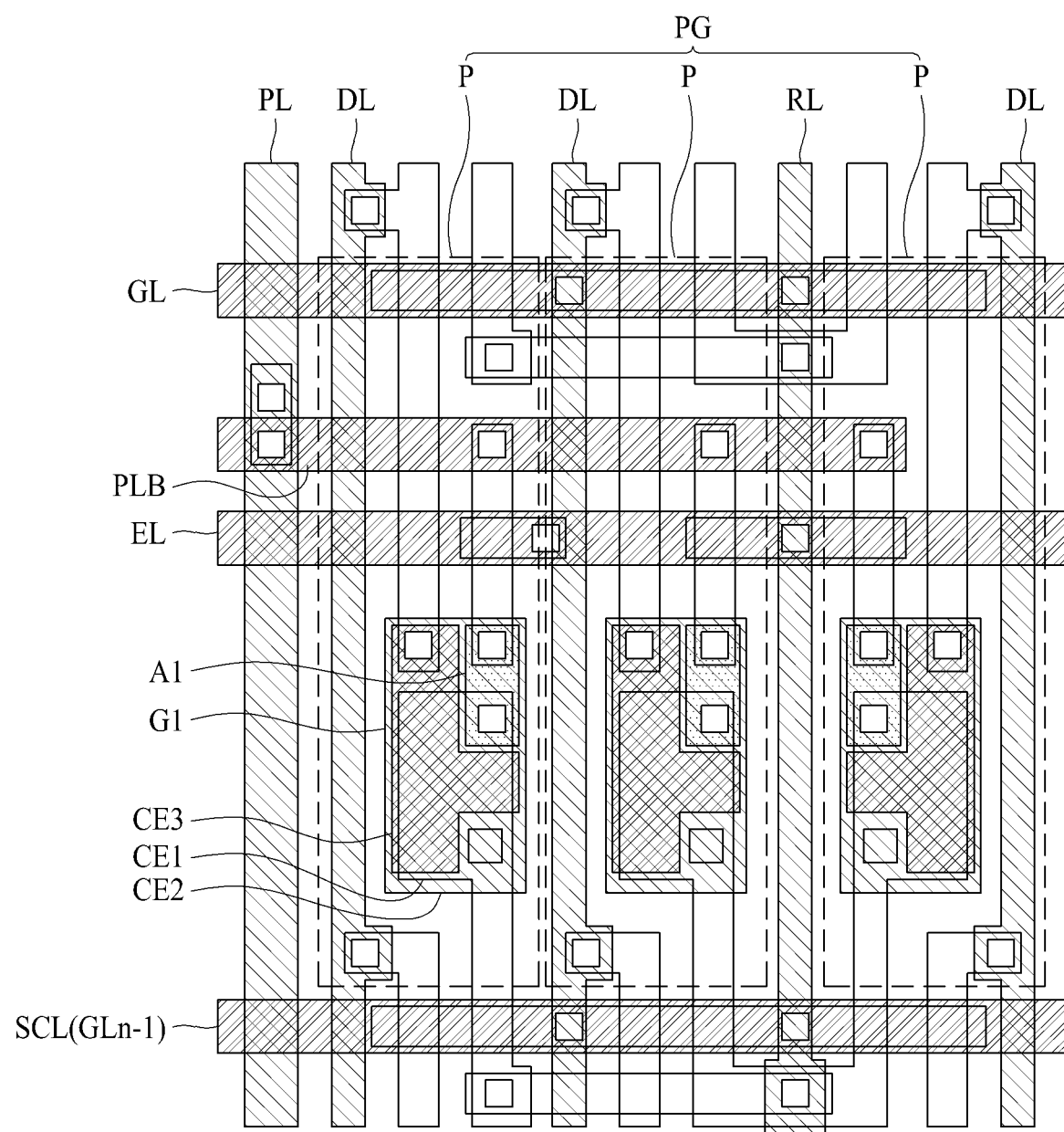
FIG. 2 is a plan view illustrating a pixel unit included the display apparatus of FIG. 1.

FIG. 2 is a plan view illustrating the pixel unit (PG) included in the display apparatus 100 of FIG. 1.

Referring to FIGS. 1 and 2, the pixel unit (PG) may include three pixels (P). Each of the pixel (P) included in one pixel unit (PG) may emit red-colored light, green-colored light, or blue-colored light, respectively. The pixel unit (PG) may express various colors through the use of pixels (P) for emitting red-colored light, green-colored light, and blue-colored light.

Figure 3:
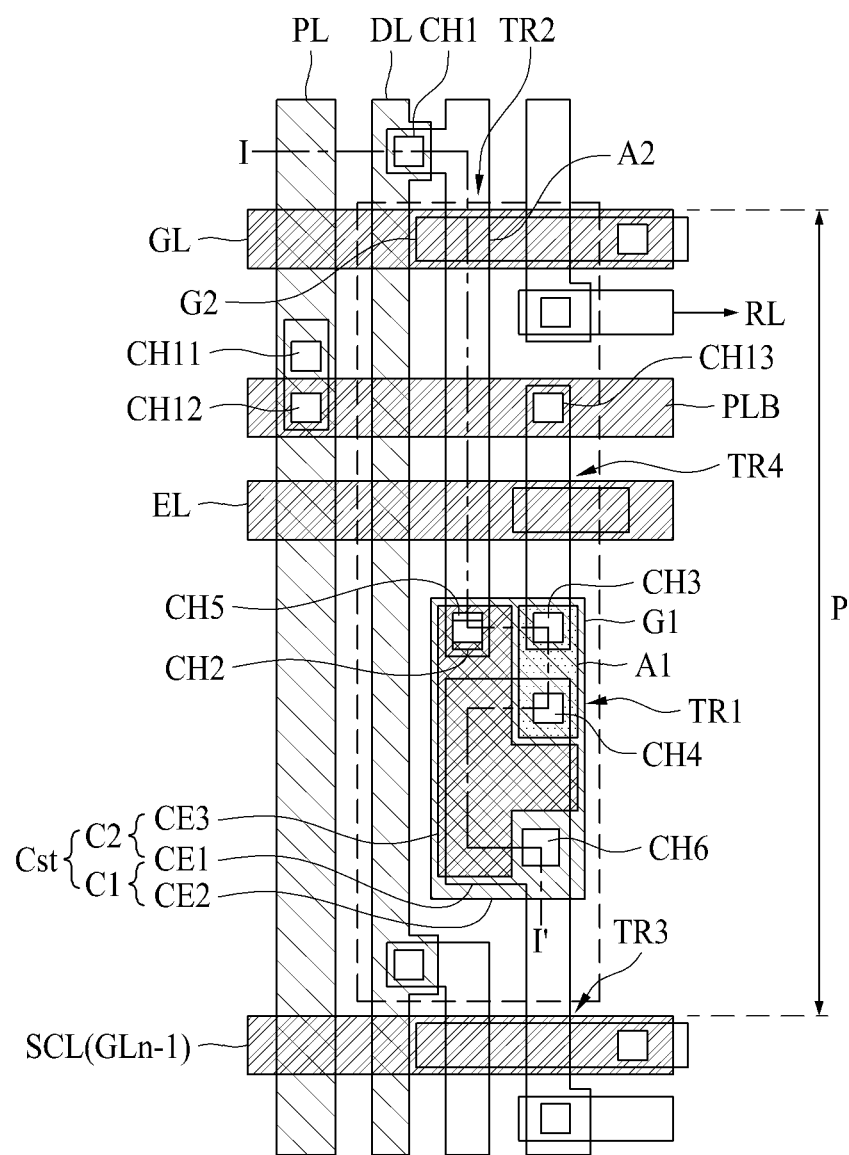
FIG. 3 is a plan view illustrating any one pixel of FIG. 1.
Figure 4:
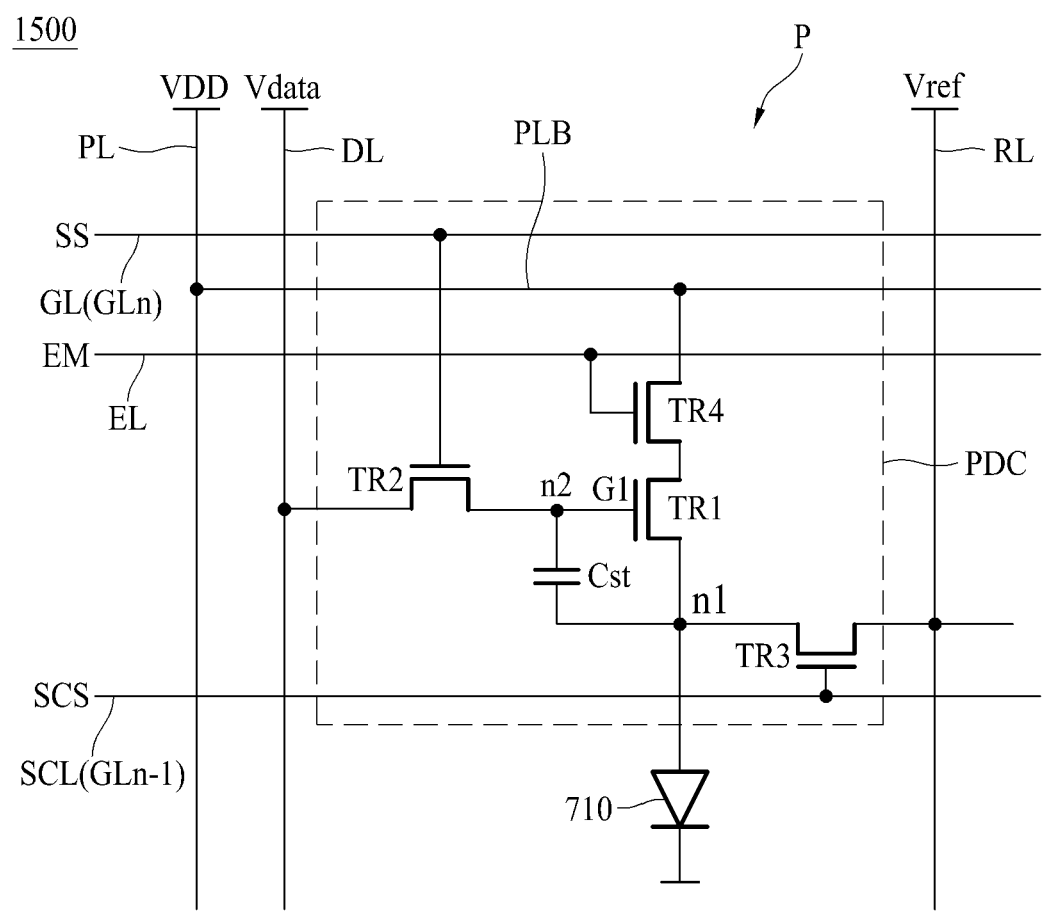
FIG. 4 is a circuit diagram for the pixel of FIG. 3.
Figure 5:
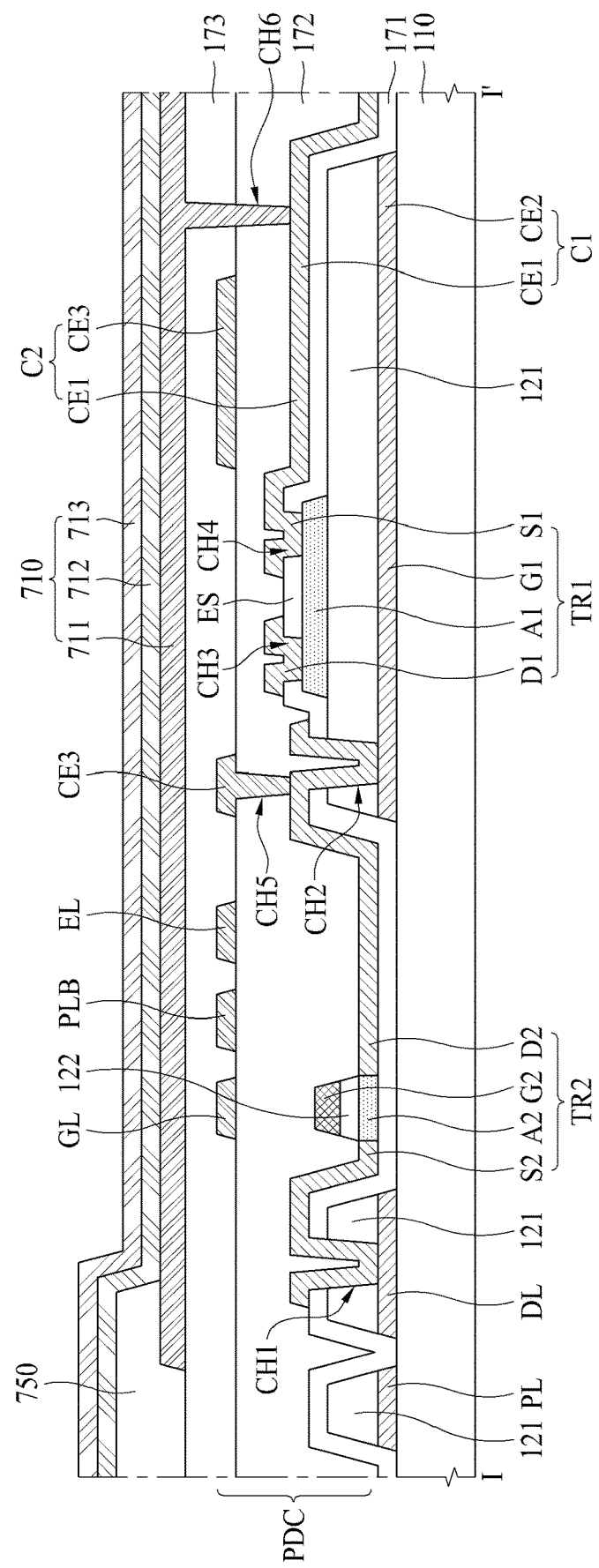
FIG. 5 is a cross-sectional view along I-I' of FIG. 3.

FIG. 3 is a plan view illustrating any one pixel (P) of FIG. 1, FIG. 4 is a circuit diagram for the pixel (P) of FIG. 3, and FIG. 5 is a cross-sectional view along I-I' of FIG. 3.

The circuit diagram of FIG. 4 corresponds to an equivalent circuit diagram for one pixel (P) in an organic light emitting display device including an organic light emitting diode (OLED) as a display unit 710.

The pixel (P) of the display apparatus 100 shown in FIG. 4 includes an organic light emitting diode (OLED) corresponding to a display unit 710, and a pixel driving circuit (PDC) for driving the display unit 710. The display unit 710 is connected with the pixel driving circuit (PDC).

On a substrate 110, there are signal lines (DL, EL, GL, PL, SCL, RL) for supplying a driving pixel to the pixel driving circuit (PDC). The pixel driving circuit (PDC) includes thin film transistors (TR1, TR2, TR3, TR4).

The pixel driving circuit (PDC) of FIG. 4 further includes the first thin film transistor (TR1) corresponding to a driving transistor, the second thin film transistor (TR2) corresponding to a switching transistor, the third thin film transistor (TR3) corresponding to a reference transistor, and the fourth thin film transistor (TR4) corresponding to an emission control transistor.

In detail, the first thin film transistor (TR1) corresponds to the driving transistor configured to control a level of current which is output to the display unit 710 in accordance with a data voltage (Vdata) transmitted through the second thin film transistor (TR2), the second thin film transistor (TR2) corresponds to the switching transistor connected with a gate line (GL) and a data line (DL), the third thin film transistor (TR3) corresponds to the reference transistor configured to sense features of the first thin film transistor (TR1), and the fourth thin film transistor (TR4) corresponds to the emission control transistor configured to control emission time by controlling the first thin film transistor (TR1).

The data voltage (Vdata) is supplied to the data line (DL), a scan signal (SS) is supplied to the gate line (GL), a driving voltage (VDD) for driving the pixel is supplied to a driving voltage line (PL), a reference voltage (Vref) is supplied to a reference line (RL), an emission control signal (EM) is supplied to an emission control line (EL), and a sensing control signal (SCS) is supplied to a sensing control line (SCL).

Referring to FIG. 4, when the gate line of the (n)th pixel (P) is referred to as "GLn", the gate line of the neighboring (n−1)th pixel (P) is "GLn−1", and the gate line of the (n−1)th pixel (P) serves as a sensing control line (SCL) of the (n)th pixel (P).

A storage capacitor (Cst) is positioned between the display unit 710 and a gate electrode (G1) of the first thin film transistor (TR1). In detail, the storage capacitor (Cst) is formed between a first node (n1) connected with the display unit 710 and a second node (n2) connected with the gate electrode (G1) of the first thin film transistor (TR1).

The second thin film transistor (TR2) is turned-on by the scan signal (SS) supplied to the gate line (GL), and the second thin film transistor (TR2) transmits the data voltage (Vdata), which is supplied to the data line (DL), to the gate electrode (G1) of the first thin film transistor (TR1).

In detail, when the second thin film transistor (TR2) is turned-on, the data voltage (Vdata) supplied through the data line (DL) is supplied to the gate electrode (G1) of the first thin film transistor (TR2). The storage capacitor (Cst) is charged with the data voltage (Vdata).

When the second thin film transistor (TR2) is turned-on, current is supplied to an emission device 710 through the second thin film transistor (TR2) by the driving voltage (Vdd) for driving the pixel, thus light is emitted from the emission device 710.

The third thin film transistor (TR3) is connected with the reference line (RL), turned-on or turned-off by the sensing control signal (SCS), and configured to sense the features of the second thin film transistor (TR2) corresponding to the driving transistor for a sensing period.

The fourth thin film transistor (TR4) transmits the driving voltage (Vdd) to the first thin film transistor (TR1) or cuts off the driving voltage (Vdd) in accordance with the emission control signal (EM). When the fourth thin film transistor (TR4) is turned-on, current is supplied to the first thin film transistor (TR), thus light is emitted from the display unit 710.

A supply amount of current to the organic light emitting diode (OLED) corresponding to the display unit 710 through the first thin film transistor (TR1) is controlled in accordance with the data voltage (Vdata), thus it is possible to control a grayscale of the light emitted from the display unit 710.

Referring to FIG. 5, the pixel driving circuit (PDC) is disposed on the substrate 110.

The substrate 110 may be formed of glass or plastic. The substrate 110 may be formed of plastic having flexibility, for example, polyimide (PI).

The pixel driving circuit (PDC) includes the first thin film transistor (TR1) and the second thin film transistor (TR2).

The first thin film transistor (TR1) includes a first gate electrode (G1) on the substrate 110, a first active layer (A1) provided to be spaced from the first gate electrode (G1) and overlapped with at least a part of the first gate electrode (G1), a first source electrode (S1) connected with the first active layer (A1), and a first drain electrode (D1) provided to be spaced from the first source electrode (S1) and connected with the first active layer (A1).

The second thin film transistor (TR2) includes a second active layer (A2) on the substrate 110, and a second gate electrode (G2) provided to be spaced from the second active layer (A2) and partially overlapped with at least a part of the second active layer (A2).

Referring to FIG. 5, the first gate electrode (G1), the data line (DL) and the driving voltage line (PL) are disposed on the substrate 110.

The first gate electrode (G1), the data line (DL) and the driving voltage line (PL) may be formed of the same material, and may be manufactured by the same process.

The first gate electrode (G1), the data line (DL) and the driving voltage line (PL) may include at least one among aluminum-based metal such as aluminum or aluminum alloy, argentums-based metal such as argentums (Ag) or argentums alloy, copper-based metal such as copper (Cu) or copper alloy, molybdenum-based metal such as molybdenum or molybdenum alloy, chrome (Cr), tantalum (Ta), neodymium (Nd), and titanium (Ti). The first gate electrode (G1), the data line (DL) and the driving voltage line (PL) may have a multi-layered structure including at least two layers with the different physical properties.

A part of the first gate electrode (G1) becomes a second capacitor electrode (CE2).

A first gate insulating film 121 is disposed on the first gate electrode (G1). The first gate insulating film 121 may include at least one of silicon oxide and silicon nitride, and may include metal oxide or metal nitride. The first gate insulating film 121 may have a single-layered structure or a multi-layered structure.

On the data line (DL) and the driving voltage line (PL), there is an insulating film which is the same as the first gate insulating film 121. According to one aspect of the present disclosure, the insulating film disposed on the data line (DL) and the driving voltage line (PL) is also referred to as the first gate insulating film 121.

The first active layer (A1) is disposed on the first gate insulating film 121. The first active layer (A1) is partially overlapped with some area of the first gate electrode (G1).

The first active layer (A1) is formed of a first active material. The first active material may be an oxide semiconductor material. According to one aspect of the present disclosure, the first active layer (A1) is an oxide semiconductor layer.

For example, the first active layer (A1) may include at least one among IZO(InZnO)-based oxide semiconductor, IGO(InGaO)-based oxide semiconductor, ITO(InSnO)-based oxide semiconductor, IGZO(InGaZnO)-based oxide semiconductor, IGZTO(InGaZnSnO)-based oxide semiconductor, GZTO(GaZnSnO)-based oxide semiconductor, GZO(GaZnO)-based oxide semiconductor, GO(GaO)-based oxide semiconductor, and ITZO(InSnZnO)-based oxide semiconductor. However, one aspect of the present disclosure is not limited to the above. The first active layer (A1) may be formed of other oxide semiconductor materials generally known to those in the art.

A first insulating interlayer 171 is disposed on the first active layer (A1). The first insulating interlayer 171 may be formed of an organic insulating material or an inorganic insulating material. The first insulating interlayer 171 serves as an etch stopper (ES) for the first active layer (A1) of the first thin film transistor (TR1). Accordingly, the first thin film transistor (TR1) may be referred to as the thin film transistor of BCE structure having the etch stopper (ES).

In detail, the first thin film transistor (TR1) according to one aspect of the present disclosure has the etch stopper (ES). The etch stopper (ES) is disposed in the same layer as the first insulating interlayer 171 on the first active layer (A1), and may be formed of the same material as that of the first insulating interlayer 171. The etch stopper (ES) protects a channel region of the first active layer (A1).

A second active layer (A2) is disposed on the first insulating interlayer 171.

The second active layer (A2) is formed of a second active material. The second active material may be an oxide semiconductor material. According to one aspect of the present disclosure, the second active layer (A2) is an oxide semiconductor layer.

The second active layer (A2) may be formed of the same oxide semiconductor material as that of the first active layer (A1), or may be formed of the different oxide semiconductor material from that of the first active layer (A1).

For example, the second active layer (A2) may include at least one among IZO(InZnO)-based oxide semiconductor, IGO(InGaO)-based oxide semiconductor, ITO(InSnO)-based oxide semiconductor, IGZO(InGaZnO)-based oxide semiconductor, IGZTO(InGaZnSnO)-based oxide semiconductor, GZTO(GaZnSnO)-based oxide semiconductor, GZO(GaZnO)-based oxide semiconductor, GO(GaO)-based oxide semiconductor, and ITZO(InSnZnO)-based oxide semiconductor. However, one aspect of the present disclosure is not limited to the above. The second active layer (A2) may be formed of other oxide semiconductor materials generally known to those in the art.

According to one aspect of the present disclosure, a first source electrode (S1), a first drain electrode (D1), a second source electrode (S2) and a second drain electrode (D2) are disposed on the first insulating interlayer 171.

The first source electrode (S1), the first drain electrode (D1), the second source electrode (S2) and the second drain electrode (D2) may be formed of the second active material.

A second gate insulating film 122 is disposed on the second active layer (A2), and a second gate electrode (G2) is disposed on the second gate insulating film 122. As a result, the second thin film transistor (TR2) including the second gate electrode (G2), the second active layer (A2), the second source electrode (S2) and the second drain electrode (D2) is completed.

According to one aspect of the present disclosure, after the second active material layer of the second active material is formed on the first insulating interlayer 171, a part of the second active material layer, which does not overlap the second gate electrode (G2), is selectively conductivized, to thereby form the first source electrode (S1), the first drain electrode (D1), the second source electrode (S2) and the second drain electrode (D2). And, other areas of the second active material layer, which are overlapped with the second gate electrode (G2), become the second active layer (A2) without being conductivized. In the present disclose, "conductivize" means making a part of an active material into a conductor.

The second active material for forming the second active layer (A2) is the oxide semiconductor material, thus the second active material may be conductivized by a plasma treatment or a hydrogen treatment.

The conductivized portion of the second active material layer may be referred to as the conducting portion. The plurality of conducting portions may be formed by conductivizing the second active material layer.

Among the conducting portions, each portion connected with the first active layer (A1) becomes the first source electrode (S1) and the first drain electrode (D1). The first drain electrode (D1) is connected with the first active layer (A1) through a third contact hole (CH3) provided in the first insulating interlayer 171. The first source electrode (S1) is connected with the first active layer (A1) through a fourth contact hole (CH4) provided in the first insulating interlayer 171. Also, referring to FIG. 5, the etch stopper (ES) is disposed between the third contact hole (CH3) and the fourth contact hole (CH4). As a result, the first thin film transistor (TR1) including the first gate electrode (G1), the first active layer (A1), the first source electrode (S1) and the first drain electrode (D1) is completed.

According to one aspect of the present disclosure, contact holes may not be completely filled with the second active material. For example, each of the first source electrode (S1) and the first drain electrode (D1) may have a recess in the contact hole (CH4, CH3). Thereafter, the first source electrode (S1) and the first drain electrode (D1) are conductivized by a plasma treatment or a hydrogen treatment.

According to one aspect of the present disclosure, a part of the first source electrode (S1) becomes a first capacitor electrode (CE1). The first capacitor electrode (CE1) together with a second capacitor electrode (CE2) forms a first capacitor (C1).

Also, among the plurality of conducting portions, the conducting portion connected with the second active layer (A2) becomes the second source electrode (S2) and the second drain electrode (D2). According to one aspect of the present disclosure, the second source electrode (S1) and the second drain electrode (D2) are formed as one body with the second active layer (A2).

The second source electrode (S2) is connected with the data line (DL) through a first contact hole (CH1) provided in the first gate insulating film 121. Also, the second drain electrode (D2) is connected with the first gate electrode (G1) through a second contact hole (CH2) provided in the first gate insulating film 121. As described above, a part of the first gate electrode (G1) becomes the second capacitor electrode (CE2). Thus, according as the second drain electrode (D2) is connected with the first gate electrode (G1), the second drain electrode (D2) is also connected with the second capacitor electrode (CE2).

According to another aspect of the present disclosure, each of the conducting portions configured to be separated from each other and connected with the second active layer (A2) may be referred to as a source region and a drain region. However, the source region and the source electrode are not distinguished from each other, and the source region may be referred to as the source electrode. In the same manner, the drain region and the drain electrode are not distinguished from each other, and the drain region may be referred to as the drain electrode.

A second insulating interlayer 172 is disposed on the first thin film transistor (TR1) and the second thin film transistor (TR2). The second insulating interlayer 172 may be formed of an organic insulating material or an inorganic insulating material.

The gate line (GL), the emission control line (EL), a driving voltage connection line (PLB) and a third capacitor electrode (CE3) are disposed on the second insulating interlayer 172.

Referring to FIG. 3, one end of the driving voltage connection line (PLB) is connected with the driving voltage line (PL) through contact holes (CH11, CH12), and the other end of the driving voltage connection line (PLB) is connected with the fourth thin film transistor (TR4) through a contact hole (CH13), thus the driving voltage is supplied to the fourth thin film transistor (TR4) corresponding to the emission control transistor of each pixel (P).

The third capacitor electrode (CE3) is connected with the second drain electrode (D2) through a fifth contact hole (CH5) provided in the second insulating interlayer 172. Accordingly, the third capacitor electrode (CE3) may be connected with the second capacitor electrode (CE2) through the second drain electrode (D2). Thus, the third capacitor electrode (CE3) is supplied with the voltage which is the same as that of the second capacitor electrode (CE2). The third capacitor electrode (CE3) is overlapped with the first capacitor electrode (CE1), to thereby form the second capacitor (C2). The first capacitor (C1) and the second capacitor (C2) constitute the storage capacitor (Cst).

A planarization layer 173 is disposed on the gate line (GL), the emission control line (EL), the driving voltage connection line (PLB) and the third capacitor electrode (CE3). The planarization layer 173 is configured to planarize an upper surface of the first thin film transistor (TR1) and an upper surface of the second thin film transistor (TR2), and also to protect the first thin film transistor (TR1) and the second thin film transistor (TR2).

A first electrode 711 of the display unit 710 is disposed on the planarization layer 173. The first electrode 711 of the display unit 710 may be connected with any one of the first source electrode (S1) and the first drain electrode (D1) included in the first thin film transistor (TR1) through a sixth contact hole (CH6) provided in the planarization layer 173 and the second insulating interlayer 172. In FIG. 5, the first electrode 711 is connected with the first source electrode (S1) of the first thin film transistor (TR1). However, it is not limited to this structure. The first electrode 711 may be connected with the first drain electrode (D1) of the first thin film transistor (TR1).

A bank layer 750 is disposed in the edge of the first electrode 711. The bank layer 750 defines an emission area of the display unit 710.

An organic emission layer 712 is disposed on the first electrode 711, and a second electrode 713 is disposed on the organic emission layer 712, thus the display unit 710 is completed. The display unit 710 shown in FIG. 5 corresponds to the organic light emitting diode (OLED). Accordingly, the display apparatus 100 according to one aspect of the present disclosure corresponds to the organic light emitting display device.

According to one aspect of the present disclosure, the first thin film transistor (TR1) is a bottom gate type thin film transistor in which the first gate electrode (G1) is positioned below the first active layer (A1). Meanwhile, the second thin film transistor (TR2) is a top gate type thin film transistor in which the second gate electrode (G2) is positioned above the second active layer (A2).

Referring to FIG. 5, in the first thin film transistor (TR1), the first gate electrode (G1) is disposed between the substrate 110 and the first active layer (A1). In the second thin film transistor (TR2), the second active layer (A2) is disposed between the substrate 110 and the second gate electrode (G2).

Also, with respect to the second active layer (A2), the first gate electrode (G1) and the second gate electrode (G2) are disposed at opposite layers to each other.

In detail, the first gate electrode (G1) is disposed while being closer to the substrate 110 in comparison to the second active layer (A2). Accordingly, with reference to the drawings, the first gate electrode (G1) is disposed at the lower layer in comparison to the second active layer (A2).

Meanwhile, the second gate electrode (G2) is disposed while being spaced farther away from the substrate 110 in comparison to the second active layer (A2). Accordingly, with reference to the drawings, the second gate electrode (G2) is disposed at the upper layer in comparison to the second active layer (A2).

Also, the second active layer (A2) is disposed in the same layer as the first source electrode (S1) and the first drain electrode (D1). According to one aspect of the present disclosure, the second active layer (A2) is formed of the oxide semiconductor material, and the first source electrode (S1) and the first drain electrode (D1) may be formed of the oxide semiconductor material which is the same as that of the second active layer (A2). However, the second active layer (A2) is the non-conductive layer, and the first source electrode (S1) and the first drain electrode (D1) are the conductive layers.

Also, the display apparatus 100 according to one aspect of the present disclosure includes the storage capacitor (Cst) connected with the first thin film transistor (TR1). The storage capacitor (Cst) includes the first capacitor (C1) and the second capacitor (C2).

In detail, the storage capacitor (Cst) includes the first capacitor electrode (CE1) formed as one body with the first source electrode (S1), and the second capacitor electrode (CE2) formed as one body with the first gate electrode (G1). The first capacitor electrode (CE1) and the second capacitor electrode (CE2) constitute the first capacitor (C1).

The storage capacitor (Cst) further includes the third capacitor electrode (CE3) which is disposed while being spaced from the first capacitor electrode (CE1) and being provided on the first capacitor electrode (CE1). Herein, the first capacitor electrode (CE1) is disposed between the second capacitor electrode (CE2) and the third capacitor electrode (CE3). The first capacitor electrode (CE1) and the third capacitor electrode (CE3) constitute the second capacitor (C2).

According to one aspect of the present disclosure, the storage capacitor (Cst) includes the first capacitor (C1) and the second capacitor (C2) disposed in the same area. Accordingly, it is possible to increase a capacitance of the storage capacitor (Cst). Accordingly, in the high-resolution display apparatus with the high-density integrated thin film transistor, it is possible to increase the capacitance of the storage capacitor (Cst) without increasing the area of the storage capacitor (Cst).

Generally, in case of the top gate type thin film transistor having the oxide semiconductor layer, there is need for the process of conductivizing the oxide semiconductor layer, and also there is need for the contact area of the source electrode and the drain electrode, thus it has limitations on size and thickness of the gate insulating film.

Meanwhile, in case of one aspect of the present disclosure, the first thin film transistor (TR1) for driving the display unit 710 is the bottom gate type. Also, the first active layer (A1) of the first thin film transistor (TR1) is formed of the oxide semiconductor, and there is no need for the process of conductivizing the oxide semiconductor layer. Thus, the size and thickness of the first gate insulating film 121 included in the first thin film transistor (TR1) may be increased if needed.

If the first gate insulating film 121 is increased in thickness, s-factor of the first thin film transistor (TR1) may be increased.

The s-factor (sub-threshold swing: s-factor) may be obtained by a reciprocal number of an inclination in a graph of a gate voltage to a drain current for a threshold voltage (Vth) section of the thin film transistor. If the s-factor becomes large, a change rate of a drain-source current (IDS) to the gate voltage for the threshold voltage (Vth) section becomes lower, thus it facilitates to control a level of the drain-source current (IDS) by controlling the gate voltage.

A pixel grayscale may be controlled by controlling the drain-source current (IDS). When it facilitates to control the level of the drain-source current (IDS), it facilitates to control the pixel grayscale.

According to one aspect of the present disclosure, it facilitates to increase the thickness of the first gate insulating film 121 of the bottom gate type first thin film transistor (TR1), thus it facilitates to increase the s-factor of the first thin film transistor (TR1). Accordingly, if the first thin film transistor (TR1) according to one aspect of the present disclosure is used as the driving thin film transistor, it facilitates to express the pixel grayscale.

According to one aspect of the present disclosure, the first gate electrode (G1), the first gate insulating film 121 and the first active layer (A1) may be formed together by the same etching process for the same manufacturing step, thus it is possible to simplify a manufacturing process and to reduce a manufacturing cost.

Also, according to one aspect of the present disclosure, the first thin film transistor (TR1) of the bottom gate type is used together with the second thin film transistor (TR2) of the top gate type so that it is possible to reduce the number of contact holes used for the electrical connection between the thin film transistor and the lines. If the number of contact holes is reduced, an area occupied by the contact holes is decreased so that it is possible to relatively increase an area for the storage capacitor (Cst). As a result, according to one aspect of the present disclosure, it is possible to sufficiently secure the capacitor area in the display apparatus 100.

Figure 6A:
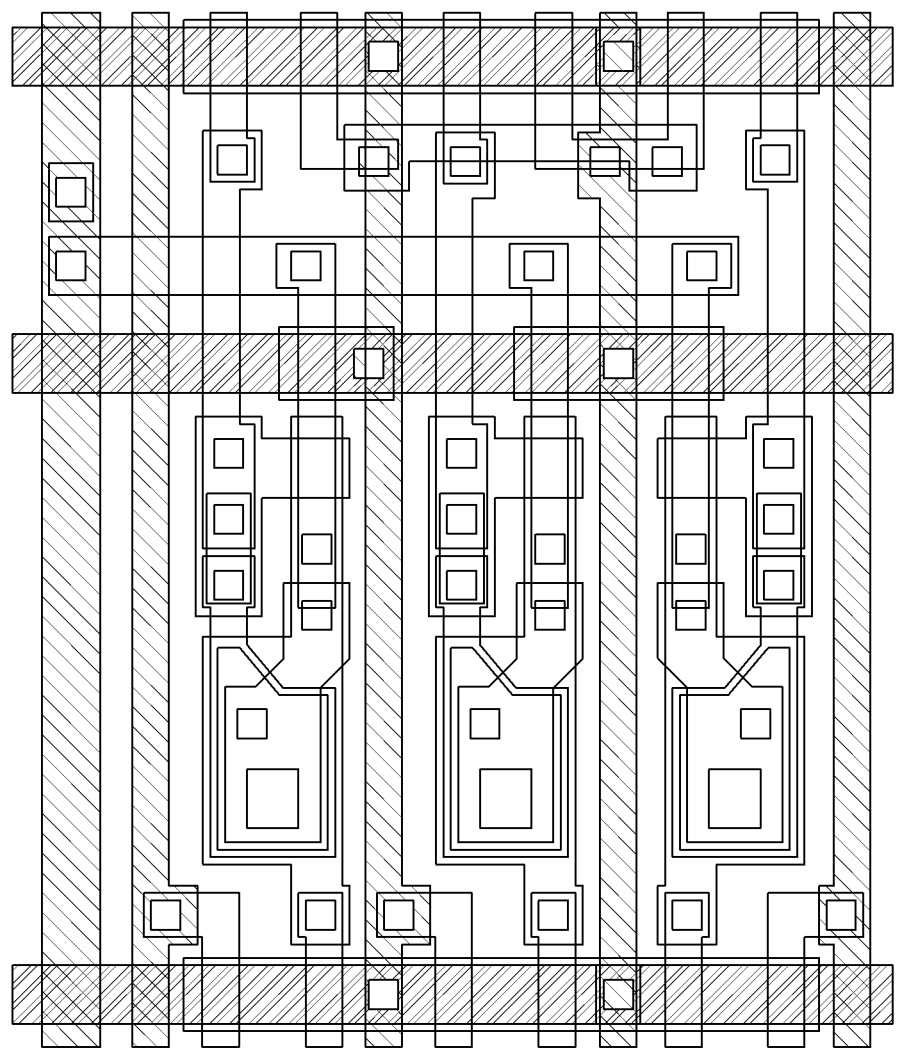
FIG. 6A is a plan view illustrating any one pixel unit in a display apparatus according to the related art.

FIG. 6A is a plan view illustrating any one pixel unit in a display apparatus according to the related art. FIG. 6B is a cross sectional view illustrating a storage capacitor, a driving transistor and a switching transistor included in a display apparatus according to the related art. In FIG. 6A, one pixel unit includes three pixels.

Referring to FIGS. 6A and 6B, both a switching thin film transistor and a driving thin film transistor are formed of top gate type thin film transistors. As a result, referring to FIG.

6A, it is known that many contact holes are provided to electrically connect thin film transistors with lines.

Meanwhile, in case of the display apparatus 100 according to one aspect of the present disclosure, the number of contact holes provided in one pixel unit (PG) is relatively smaller than the number of contact holes provided in one pixel unit of the display apparatus according to the related art. For example, the pixel unit of FIG. 6A includes 39 contact holes. Meanwhile, the pixel unit (PG) of the display apparatus 100 according to one aspect of the present disclosure includes 26 contact holes. According to the present disclosure, the number of contact holes in the pixel driving circuit is reduced, thus the area of the storage capacitor (Cst) is increased by the reduced number of contact holes.

Figure 7:
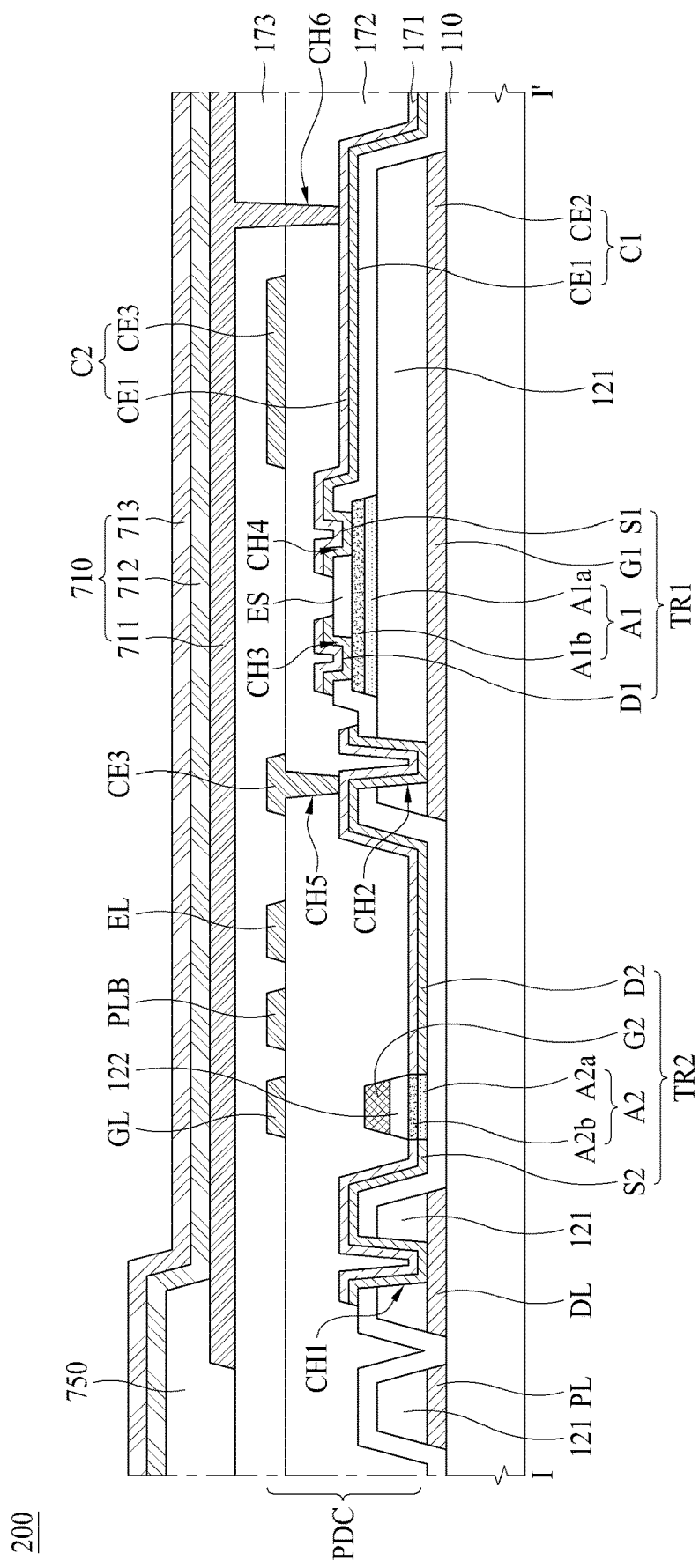
FIG. 7 is a cross-sectional view illustrating a pixel of a display apparatus according to another aspect of the present disclosure.

FIG. 7 is a cross-sectional view illustrating a pixel (P) of a display apparatus 200 according to another aspect of the present disclosure. Hereinafter, a repetitive description for the same parts will be omitted so as to avoid unnecessary repetition.

According to another aspect of the present disclosure, at least one of a first active layer (A1) and a second active layer (A2) includes a first oxide semiconductor layer, and a second oxide semiconductor layer on the first oxide semiconductor layer.

Referring to FIG. 7, the first active layer (A1) includes a first oxide semiconductor layer (A1a), and a second oxide semiconductor layer (A1b) on the first oxide semiconductor layer (A1a). The first oxide semiconductor layer (A1a) serves as a supporting layer for supporting the second oxide semiconductor layer (A1b), and the second oxide semiconductor layer (A1b) serves as a channel layer. A channel of the first active layer (A1) is generally formed in the second oxide semiconductor layer (A1b).

The first oxide semiconductor layer (A1a) serving as the supporting layer has great film stability and good mechanical properties. For the great film stability, the first oxide semiconductor layer (A1a) may include gallium (Ga), wherein gallium (Ga) forms a stabilized bonding to oxygen, and gallium oxide has good film stability For example, the first oxide semiconductor layer (A1a) may include at least one IGZO (InGaZnO)-based oxide semiconductor material, IGO(InGaO)-based oxide semiconductor material, IGTO(InGaSnO)-based oxide semiconductor material, IGZTO(InGaZnSnO)-based oxide semiconductor material, GZTO(GaZnSnO)-based oxide semiconductor material, GZO(GaZnO)-based oxide semiconductor material, and GO(GaO)-based oxide semiconductor material.

For example, the second oxide semiconductor layer (A1b) may include at least one among IZO(InZnO)-based oxide semiconductor material, IGO(InGaO)-based oxide semiconductor material, ITO(InSnO)-based oxide semiconductor material, IGZO(InGaZnO)-based oxide semiconductor material, IGZTO(InGaZnSnO)-based oxide semiconductor material, GZTO(GaZnSnO)-based oxide semiconductor material, and ITZO(InSnZnO)-based oxide semiconductor material. However, one aspect of the present disclosure is not limited to the above. The second oxide semiconductor layer (A1b) may be formed of other oxide semiconductor materials generally known to those in the art.

Also, the second active layer (A2) may include a first oxide semiconductor layer (A2a), and a second oxide semiconductor layer (A2b) on the first oxide semiconductor layer (A2a). The first oxide semiconductor layer (A2a) serves as a supporting layer for supporting the second oxide semiconductor layer (A2b), and the second oxide semiconductor layer (A2b) serves as a channel layer. A channel of the second active layer (A2) is generally formed in the second oxide semiconductor layer (A2b).

The first oxide semiconductor layer (A2a) serving as the supporting layer has great film stability and good mechanical properties. For the great film stability, the first oxide semiconductor layer (A2a) may include gallium (Ga), wherein gallium (Ga) forms a stabilized bonding to oxygen, and gallium oxide has good film stability For example, the first oxide semiconductor layer (A2a) may include at least one IGZO (InGaZnO)-based oxide semiconductor material, IGO(InGaO)-based oxide semiconductor material, IGTO(InGaSnO)-based oxide semiconductor material, IGZTO(InGaZnSnO)-based oxide semiconductor material, GZTO(GaZnSnO)-based oxide semiconductor material, GZO(GaZnO)-based oxide semiconductor material, and GO(GaO)-based oxide semiconductor material.

For example, the second oxide semiconductor layer (A2b) may include at least one among IZO(InZnO)-based oxide semiconductor material, IGO(InGaO)-based oxide semiconductor material, ITO(InSnO)-based oxide semiconductor material, IGZO(InGaZnO)-based oxide semiconductor material, IGZTO(InGaZnSnO)-based oxide semiconductor material, GZTO(GaZnSnO)-based oxide semiconductor material, and ITZO(InSnZnO)-based oxide semiconductor material. However, one aspect of the present disclosure is not limited to the above. The second oxide semiconductor layer (A2b) may be formed of other oxide semiconductor materials generally known to those in the art.

Figure 8:
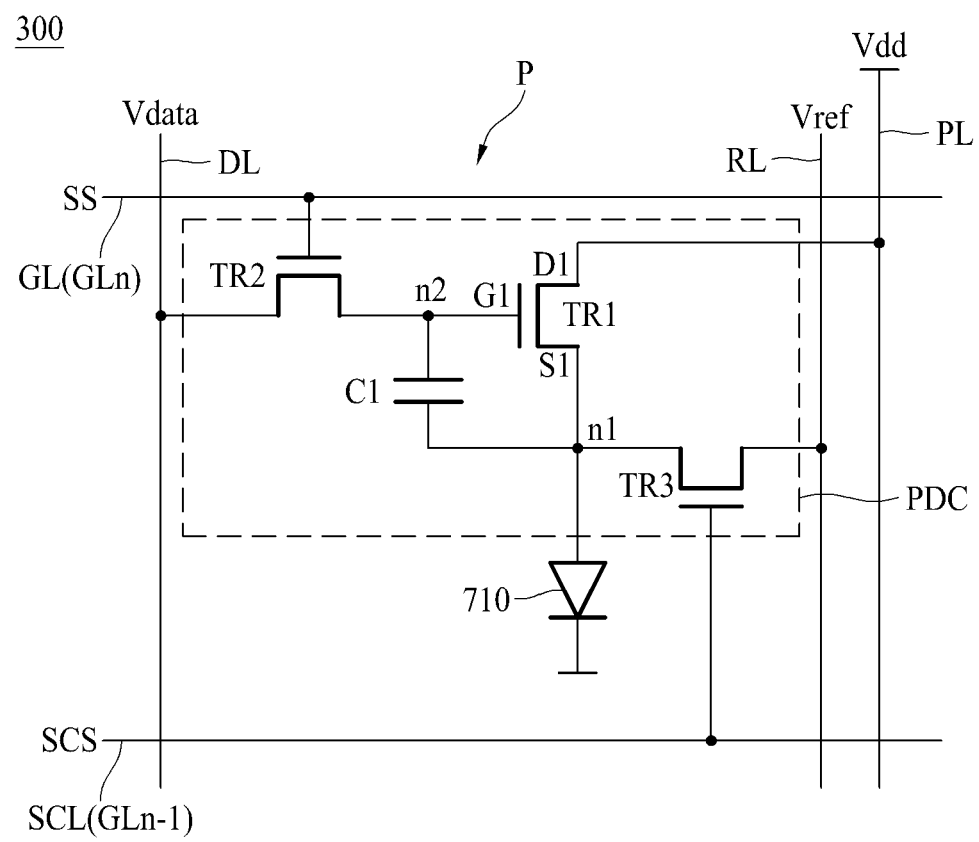
FIG. 8 is a circuit diagram illustrating a pixel of a display apparatus according to another aspect of the present disclosure.

FIG. 8 is a circuit diagram illustrating a pixel of a display apparatus 300 according to another aspect of the present disclosure. FIG. 8 is an equivalent circuit diagram for a pixel (P) of an organic light emitting display device.

The pixel (P) of the display apparatus 300 shown in FIG. 8 includes an organic light emitting diode (OLED) corresponding to a display unit 710, and a pixel driving circuit (PDC) for driving the display unit 710. The display unit 710 is connected with the pixel driving circuit (PDC).

In the pixel (P), there are signal lines (DL, GL, PL, RL, SCL) for supplying a signal to the pixel driving circuit (PDC).

A data voltage (Vdata) is supplied to a data line (DL), a scan signal (SS) is supplied to a gate line (GL), a driving voltage (VDD) for driving the pixel is supplied to a driving voltage line (PL), a reference voltage (Vref) is supplied to a reference voltage line (RL), and a sensing control signal (SCS) is supplied to a sensing control line (SCL).

Referring to FIG. 8, when the gate line of the (n)th pixel (P) is referred to as "GLn", the gate line of the neighboring (n−1)th pixel (P) is "GLn−1", and the gate line of the (n−1)th pixel (P) serves as the sensing control line (SCL) of the (n)th pixel (P).

The pixel driving circuit (PDC) includes a second thin film transistor (TR2, switching transistor) connected with the gate line (GL) and the data line (DL), a first thin film transistor (TR1, driving transistor) configured to control a level of current which is provided to the display unit 710 in accordance with the data voltage (Vdata) transmitted through the second thin film transistor (TR2), and a third thin film transistor (TR3, reference transistor) configured to sense the properties of the first thin film transistor (TR1).

A storage capacitor (Cst) is positioned between the display unit 710 and a gate electrode (G2) of the first thin film transistor (TR1).

The second thin film transistor (TR2) is turned-on by the scan signal (SS) supplied to the gate line (GL), and the second thin film transistor (TR2) transmits the data voltage (Vdata), which is supplied to the data line (DL), to the first gate electrode (G1) of the first thin film transistor (TR1).

The third thin film transistor (TR3) is connected with the reference line (RL) and a first node (n1) between the emission device 710 and the first thin film transistor (TR1). The third thin film transistor (TR3) is turned-on or turned-off by the sensing control signal (SCS), and the third thin film transistor (TR3) senses the properties of the first thin film transistor (TR1) corresponding the driving transistor for a sensing period.

A second node (n2) connected with the first gate electrode (G1) of the first thin film transistor (TR1) is connected with the second thin film transistor (TR2). The storage capacitor (Cst) is formed between the second node (n2) and the first node (n1).

When the second thin film transistor (TR2) is turned-on, the data voltage (Vdata) supplied through the data line (DL) is supplied to the first gate electrode (G1) of the first thin film transistor (TR1). The storage capacitor (Cst) formed between a first source electrode (S1) and the first gate electrode (G1) of the first thin film transistor (TR1) is charged with the data voltage (Vdata).

When the first thin film transistor (TR1) is turned-on, the current is supplied to the emission device 710 through the first thin film transistor (TR1) by the driving voltage (Vdd) for driving the pixel, thus light is emitted from the emission device 710.

The pixel driving circuit (PDC) according to another aspect of the present disclosure may be formed in various structures in addition to the above-described structure. For example, the pixel driving circuit (PDC) may include five thin film transistors or more.

Hereinafter, a method for manufacturing the display apparatus 100 according to one aspect of the present disclosure will be described with reference to FIGS. 9A to 9I and FIGS. 10A to 10D.

FIGS. 9A to 9I are cross-sectional views illustrating the method for manufacturing the display apparatus 100 according to one aspect of the present disclosure, and FIGS. 10A to 10D are plan views illustrating the method for manufacturing the display apparatus 100 according to one aspect of the present disclosure.

Figure 9A:
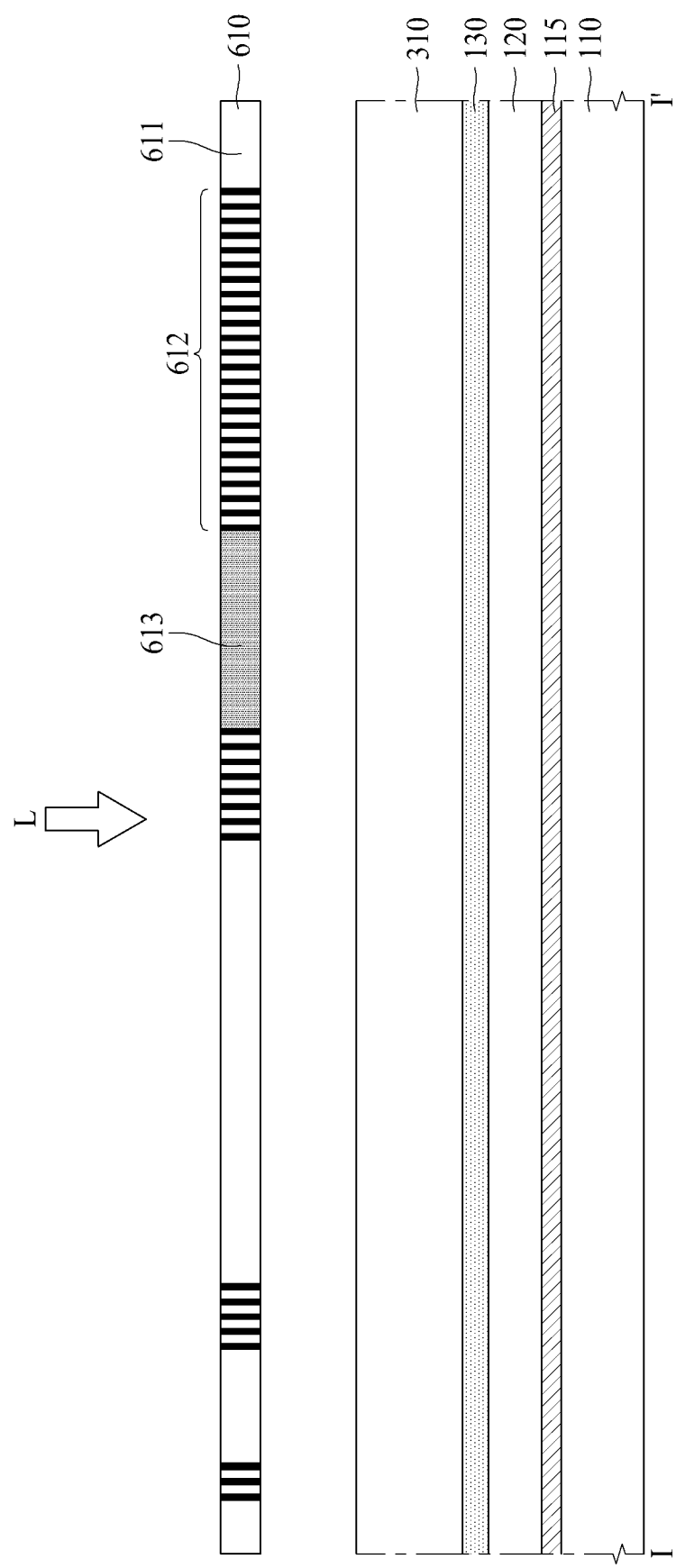

Referring to FIG. 9A, first, a first conductive material layer 115, a first insulating material layer 120 and a first active material layer 130 are sequentially deposited on the first substrate 110. Herein, the first conductive material layer 115 is formed of a first conductive material, the first insulating material layer 120 is formed of a first insulating material, and the first active material layer 130 is formed of a first active material.

According to one aspect of the present disclosure, the first active material is an oxide semiconductor material, and the first active material layer 130 is an oxide semiconductor layer. The first active material layer 130 may include at least one among IZO(InZnO)-based oxide semiconductor material, IGO(InGaO)-based oxide semiconductor material, ITO (InSnO)-based oxide semiconductor material, IGZO(In-GaZnO)-based oxide semiconductor material, IGZTO (InGaZnSnO)-based oxide semiconductor material, GZTO (GaZnSnO)-based oxide semiconductor material, GZO (GaZnO)-based oxide semiconductor material, GO(GaO)-based oxide semiconductor material, and ITZO(InSnZnO)-based oxide semiconductor material.

Also, referring to FIG. 9A, a photoresist layer 310 is formed on the first active material layer 130. The photoresist layer 310 may be formed of negative photoresist (PR) material or positive photoresist (PR) material. According to one aspect of the present disclosure, the photoresist layer 310 may be formed of the positive photoresist (PR) material.

A pattern mask 610 is disposed on the photoresist layer 310, and light (L) is irradiated through the pattern mask 610, thus an exposure for the photoresist layer 310 is carried out.

A half-tone mask may be used for the pattern mask 610. Referring to FIG. 9A, the pattern mask 610 is the half-tone mask including a transmitting portion 611, a semi-transmitting portion 612, and a light-shielding portion 613.

The photoresist layer 310 is selectively exposed by the exposure through the use of pattern mask 610. The light-shielding layer 613 of the pattern mask 610 corresponds to the area to be provided with the first active layer (A1). The semi-transmitting portion 612 of the pattern mask 610 corresponds to the area to be provided with the first gate electrode (G1), the data line (DL) and the driving voltage line (PL). The transmitting portion 611 of the pattern mask 610 corresponds to the area from which the first conductive material layer 115, the first insulating material layer 120 and the first active layer 130 are removed completely.

Referring to FIG. 9B, the selectively-exposed photoresist layer 310 is developed, to thereby form photoresist patterns 310a, 310b and 310b.

Referring to FIG. 9C, the first gate electrode (G1) of the first conductive material, the first gate insulating film 121 of the first insulating material, and the first active layer (A1) of the first active material are formed by a selective etching process.

In detail, an etching process using the photoresist patterns 310a, 310b and 310c as a mask is carried out so that the first active layer (A1) is formed by patterning the first active material layer 130, the first gate insulating film 121 is formed by patterning the first insulating material layer 120, and the first gate electrode (G1) is formed by patterning the first conductive material layer 115. Also, the data line (DL) and the driving voltage line (PL) are formed by patterning the first conductive material layer 115.

FIG. 9C corresponds to 10A on the plane.

As described above, a first mask process (MASK1) is carried out so as to form the first gate electrode (G1) and the first active layer (A1).

Referring to FIG. 9D, the first insulating interlayer 171 is formed on the first active layer (A1). And, the contact holes are formed in the first insulating interlayer 171 and the first gate insulating film 121. In detail, the first contact hole (CH1) is formed in the first insulating interlayer 171 and the first gate insulating film 121 so that a part of the data line (DL) is exposed, the second contact hole (CH2) is formed in the first insulating interlayer 171 and the first gate insulating film 121 so that a part of the first gate electrode (G1) is exposed, and the third contact hole (CH3) and the fourth contact hole (CH4) are formed in the first insulating interlayer 171 so that the first active layer (A1) is partially exposed.

In order to form the contact holes in the first insulating interlayer 171 and the first gate insulating film 121, a second mask process (MASK2) is carried out.

Also, the etch stopper (ES) is formed on the first active layer (A1) for the process of forming the contact holes (CH1, CH2, CH3, CH4). The etch stopper (ES) is formed between the third contact hole (CH3) and the fourth contact hole (CH4), and is configured to protect the channel region of the first active layer (A1).

Referring to FIG. 9E, a second active material 151, 152 and 153 is formed on the first insulating interlayer 171. The second active material layer 151, 152 and 153 includes a plurality of patterns.

A third mask process (MASK3) is carried out so as to form the second active material layer 151, 152 and 153.

FIG. 9E corresponds to 10B on the plane.

The oxide semiconductor material may be used for the second active material. According to one aspect of the present disclosure, the second active material layer 151, 152 and 153 corresponds to the oxide semiconductor layer.

The second active material layer 151, 152 and 153 may be formed of the same semiconductor material as that of the first active material layer 130, or may be formed of the different semiconductor material from that of the first active material layer 130.

For example, the second active material layer 151, 152 and 153 may include at least one among IZO(InZnO)-based oxide semiconductor material, IGO(InGaO)-based oxide semiconductor material, ITO(InSnO)-based oxide semiconductor material, IGZO(InGaZnO)-based oxide semiconductor material, IGZTO(InGaZnSnO)-based oxide semiconductor material, GZTO(GaZnSnO)-based oxide semiconductor material, GZO (GaZnO)-based oxide semiconductor material, GO(GaO)-based oxide semiconductor material, and ITZO(InSnZnO)-based oxide semiconductor material.

Referring to FIG. 9F, the second gate insulating film 122 and the second gate electrode (G2) are formed on at least a part of the second active material layer 151, 152 and 153.

FIG. 9F corresponds to 10C on the plane.

A fourth mask process (MASK4) is carried out so as to form the second gate insulating film 122 and the second gate electrode (G2).

After forming the second gate insulating film 122 and the second gate electrode (G2), a part of the second active material layer 151, 152 and 153 being not overlapped with the second gate electrode (G2) becomes conductivized. As a result, it is possible to form the first source electrode (S1), the first drain electrode (D1), the second source electrode (S2) and the second drain electrode (D2).

A plasma treatment or hydrogen treatment may be carried out for the conductivizing process.

The second active material for forming the second active layer (A2) is the oxide semiconductor material, thus the second active material becomes conductivized by the plasma treatment or hydrogen treatment.

The conductivized portion of the second active material layer 151, 152 and 153 may be referred to as the conducting portions. The plurality of conducting portions may be formed by the conductivizing process of the second active material layer 151, 152 and 153.

For the conductivizing process, the second gate electrode (G2) serves as a mask. Thus, the area of the second active material layer being overlapped with the second gate electrode (G2) is not conductivized. The area of the second active material layer being not conductivized while being overlapped with the second gate electrode (G2) becomes the second active layer (A2). As a result, it is possible to form the second thin film transistor (TR2) including the second gate electrode (G2), the second active layer (A2), the second source electrode (S2) and the second drain electrode (D2). The second source electrode (S2) is connected with the data line (DL) through the first contact hole (CH1) provided in the first gate insulating film 121, and the second drain electrode (D2) is connected with the first gate electrode (G1) through the second contact hole (CH2) provided in the first gate insulating film 121.

The first source electrode (S1) and the first drain electrode (D1) are formed while being spaced from each other and being connected with the first active layer (A1) by the conductivizing step.

Referring to FIG. 9F, the area of the conducting portions connected with the first active layer (A1) becomes the first source electrode (S1) and the first drain electrode (D1). For example, the area of the conducting portions connected with the first active layer (A1) becomes the first source electrode (S1), and the area being spaced from the first source electrode (S1) and being connected with the first active layer (A1) becomes the first drain electrode (D1). In detail, the first drain electrode (D1) is connected with the first active layer (A1) through the third contact hole (CH3) provided in the first insulating interlayer 171. The first source electrode (S1) is connected with the first active layer (A1) through the fourth contact hole (CH4) provided in the first insulating interlayer 171. Also, referring to FIG. 5, the etch stopper (ES) is formed between the third contact hole (CH3) and the fourth contact hole (CH4). As a result, the first thin film transistor (TR1) including the first gate electrode (G1), the first active layer (A1), the first source electrode (S1) and the first drain electrode (D1) is formed.

Also, referring to FIG. 9F, some area of the first source electrode (S1) and some area of the first gate electrode (G1), which are overlapped with each other, form the first capacitor (C1). In detail, the first capacitor (C1) is formed by the first capacitor electrode (CE1) formed as one body with the first source electrode (S1), and the second capacitor electrode (CE2) formed as one body with the first gate electrode (G1).

The storage capacitor (Cst) includes the first capacitor (C1).

Referring to FIG. 9G, the second insulating interlayer 172 is formed on the first thin film transistor (TR1), the second thin film transistor (TR2), and the first capacitor (C1). The second insulating interlayer 172 may be formed of an organic or inorganic insulating material. The fifth contact hole (CH5) is formed in the second insulating layer 172, thus a part of the second drain electrode (D2) is exposed.

In order to form the fifth contact hole (CH5) in the second insulating interlayer 172, a fifth mask process (MASK5) is carried out.

Figure 9H:
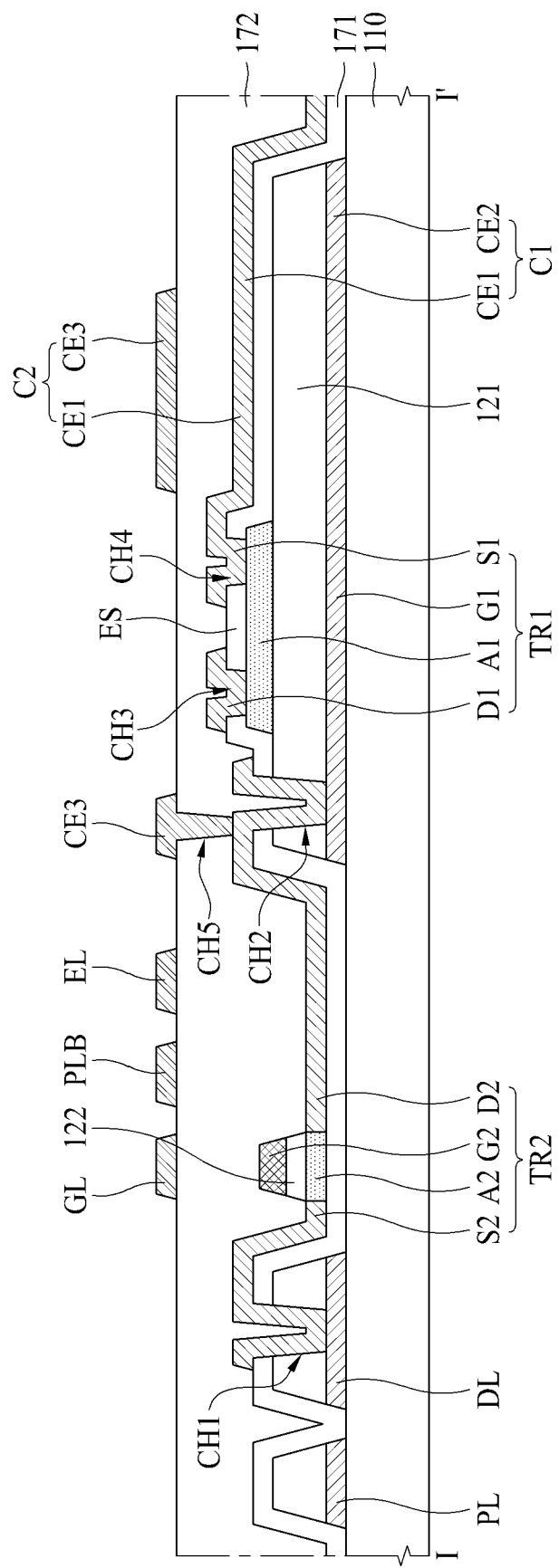

Referring to FIG. 9H, the gate line (GL), the emission control line (EL), the driving voltage connection line (PLB) and the third capacitor electrode (CE3) are formed on the second insulating interlayer 172. The gate line (GL), the emission control line (EL), the driving voltage connection line (PLB and the third capacitor electrode (CE3) are referred to as upper lines.

Figure 10A:
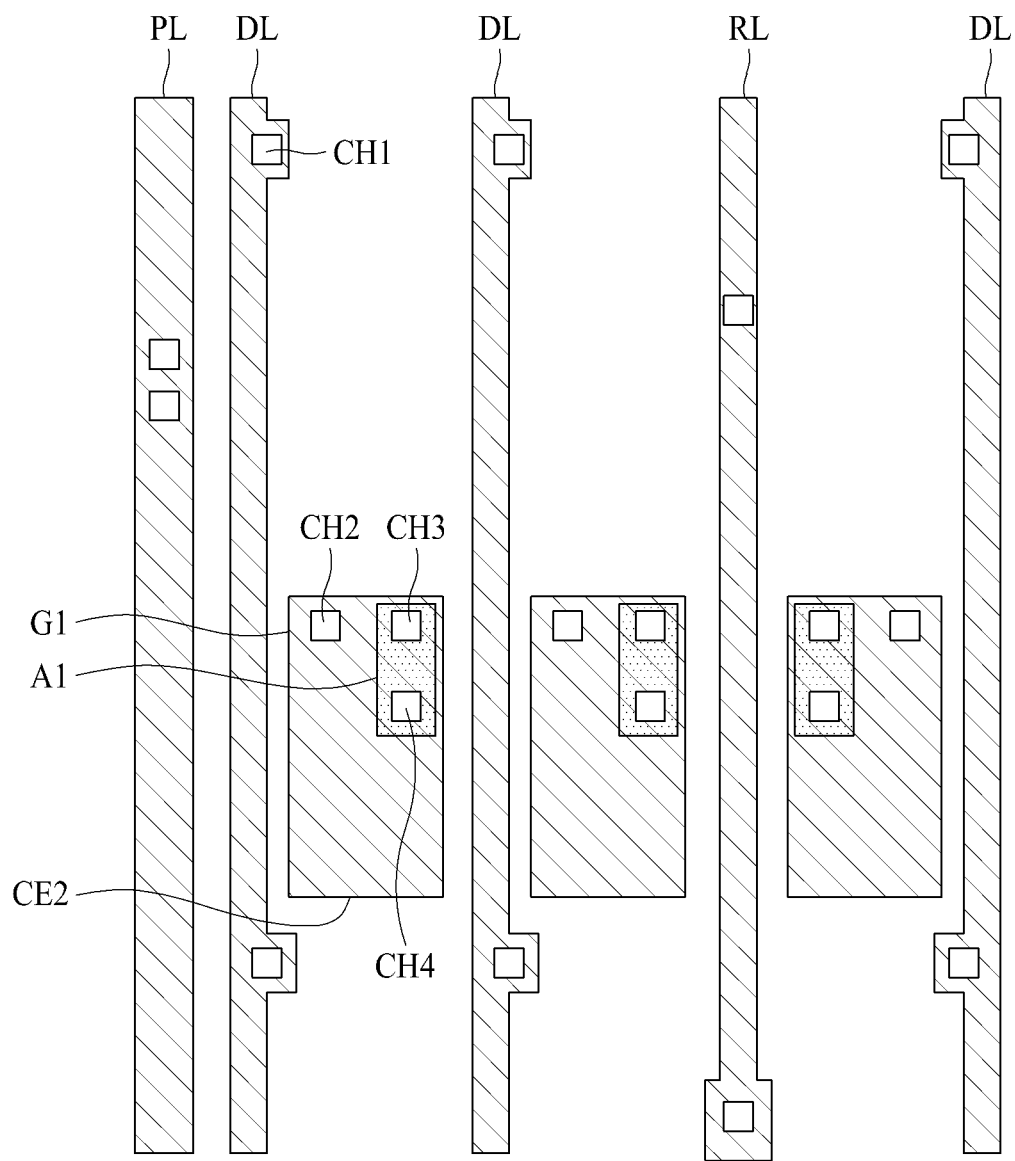
FIGS. 10A, 10B, 10C and 10D are plan views illustrating a method for manufacturing a display apparatus according to one aspect of the present disclosure.
Figure 10B:
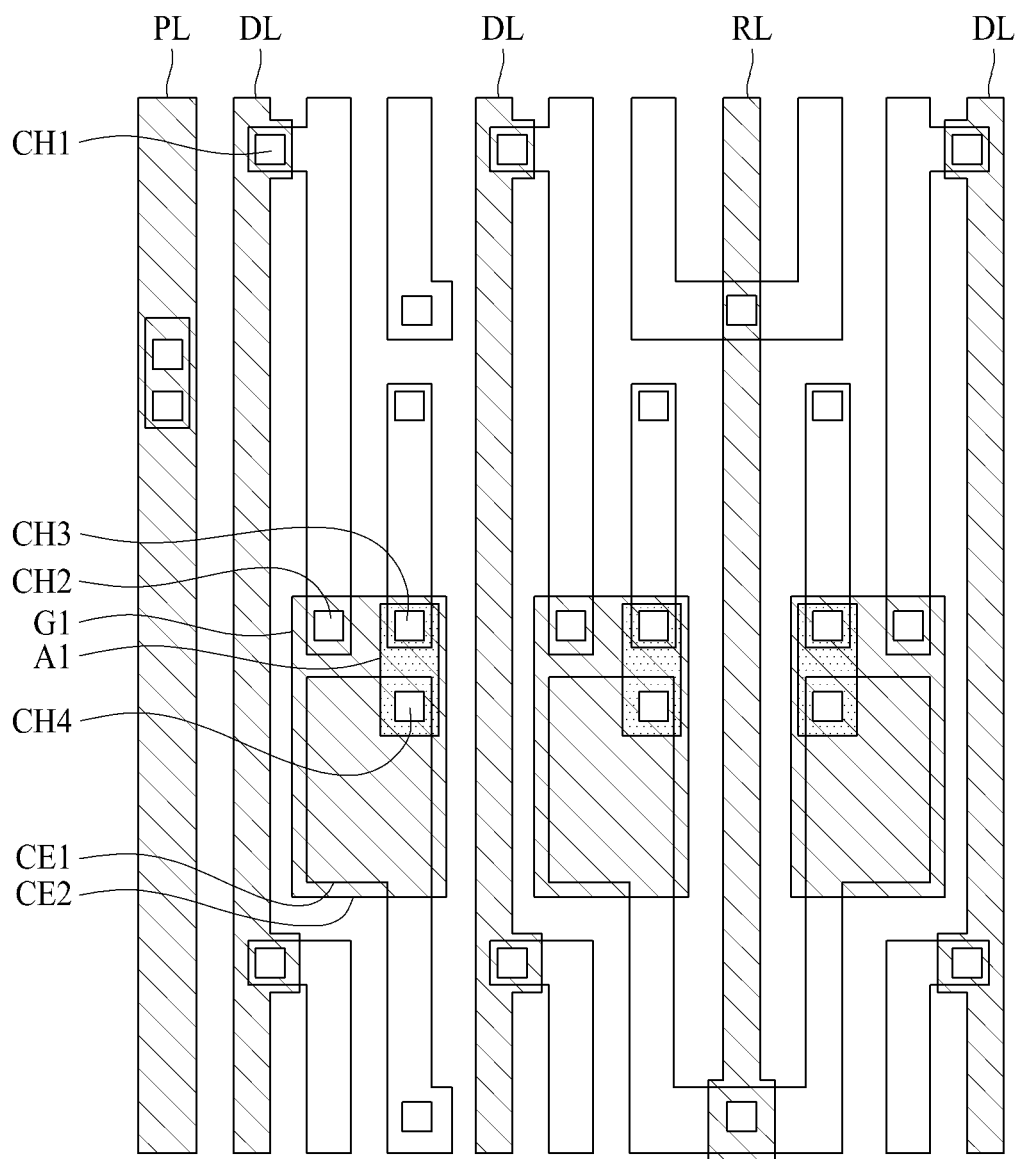
Figure 10C:
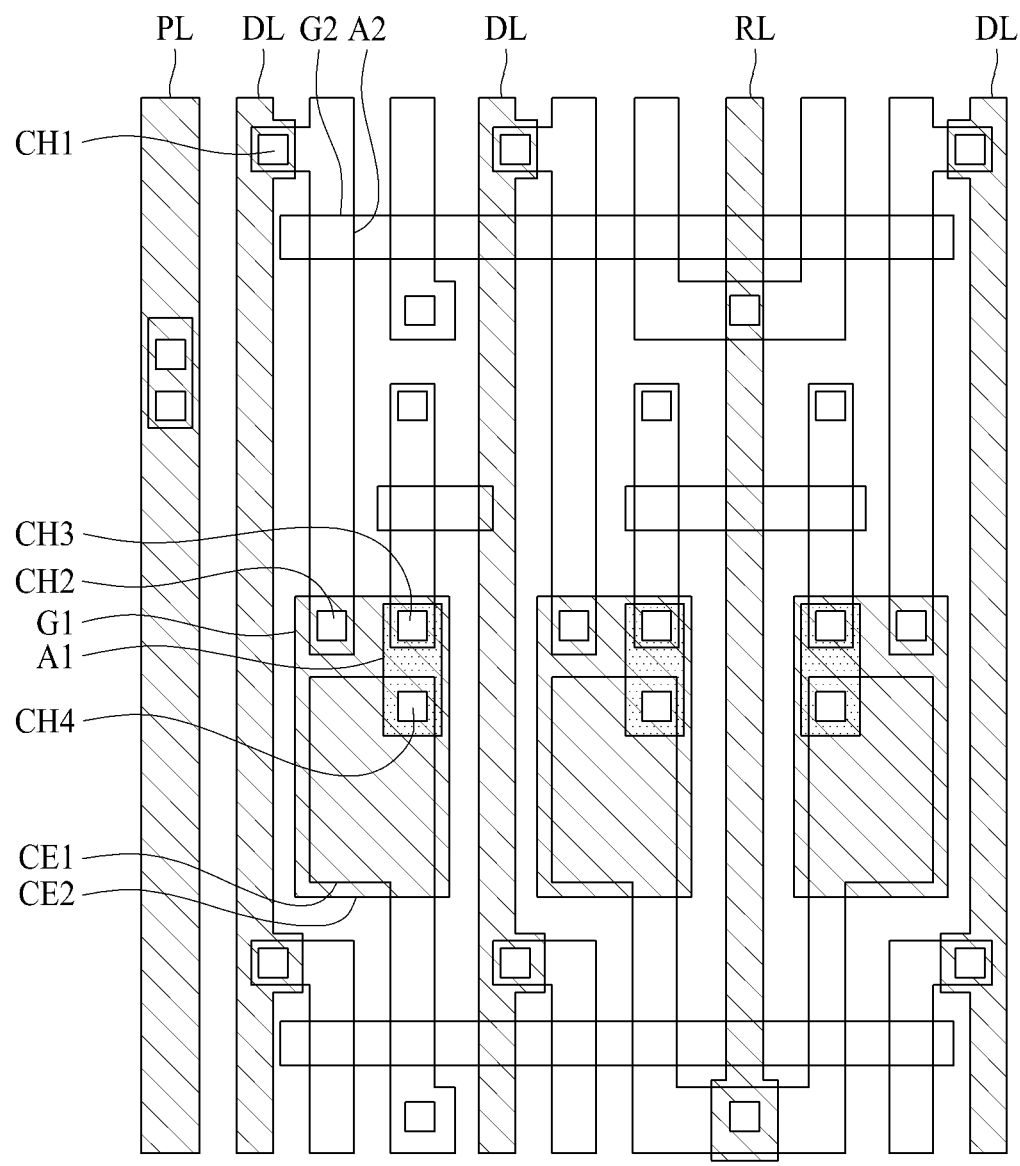
Figure 10D:
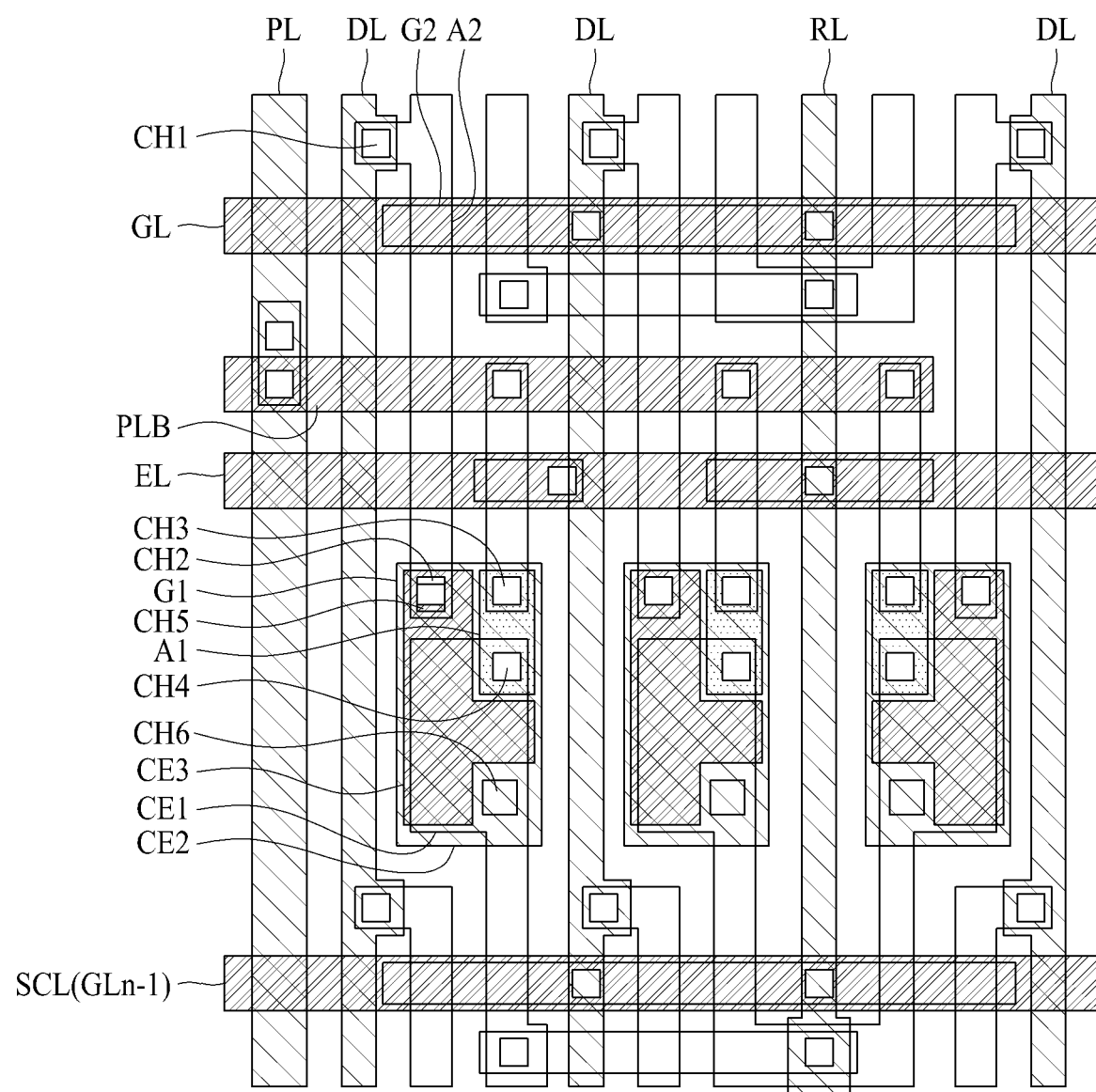

FIG. 9H corresponds to FIG. 10D on the plane.

A sixth mask process (MASK6) is carried out in order to form the upper lines such as the gate line (GL), the emission control line (EL), the driving voltage connection line (PLB) and the third capacitor electrode (CE3). As a result, the pixel driving circuit (PDC) is formed.

According to one aspect of the present disclosure, the pixel driving circuit (PDC) is formed by the six mask processes.

Referring to FIG. 9H, the second insulating interlayer 172 is formed on the first source electrode (S1), and the third capacitor electrode (CE3) is partially overlapped with at least a part of the first source electrode (S1) on the second insulating interlayer 172. The third capacitor electrode (CE3) is connected with the second drain electrode (D2) through the fifth contact hole (CH5) provided in the second insulating interlayer 172. Accordingly, the third capacitor electrode (CE3) may be connected with the second capacitor electrode (CE2) through the second drain electrode (D2).

The third capacitor electrode (CE3) together with the first capacitor electrode (CE1) forms the second capacitor (C2).

The first capacitor (C1) and the second capacitor (C2) constitute the storage capacitor (Cst).

Figure 9I:
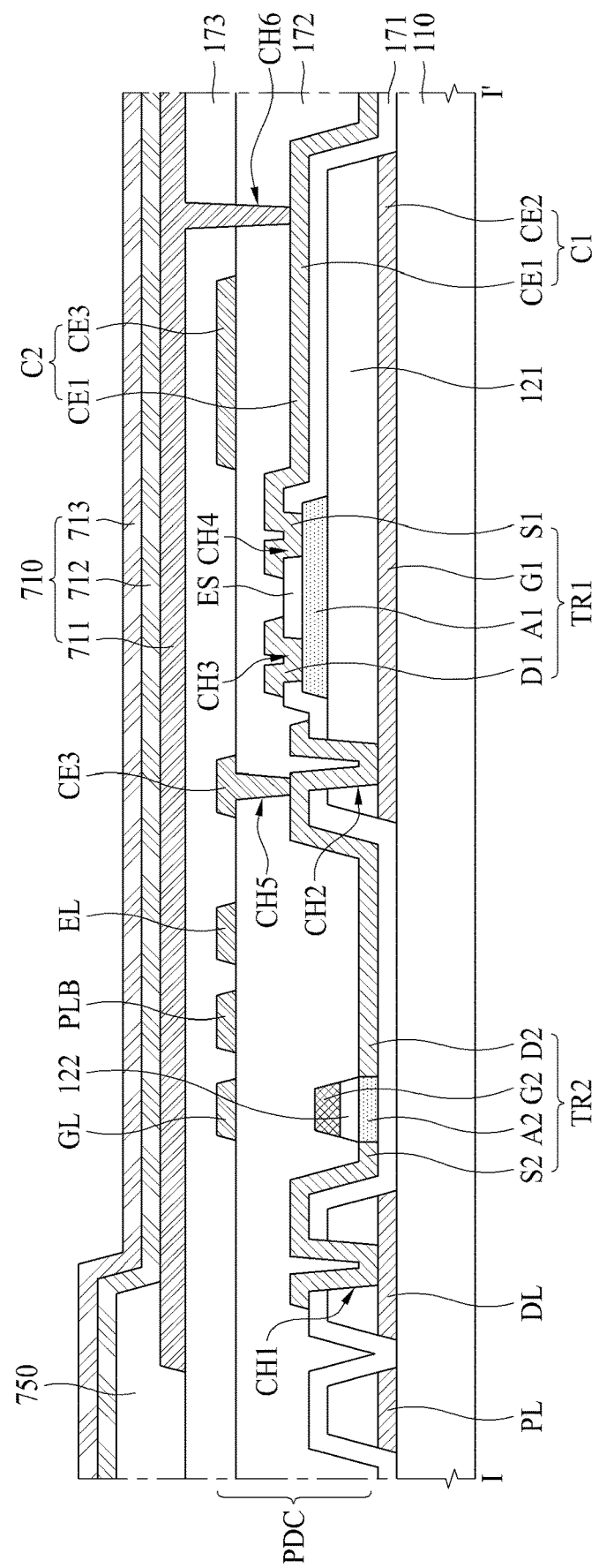

Then, referring to FIG. 9I, the planarization layer 173 is disposed on the gate line (GL), the emission control line (EL), the driving voltage connection line (PLB) and the third capacitor electrode (CE3), the first electrode 711 of the display unit 710 is disposed on the planarization layer 173, the organic emission layer 712 is disposed on the first electrode 711, and the second electrode 713 is disposed on the organic emission layer 712, to thereby complete the display apparatus 100. The first electrode 711 is connected with the source electrode (S1) of the first thin film transistor (TR1) through the sixth contact hole (CH6) provided in the planarization layer 173 and the second insulating interlayer 172.

Figure 11:
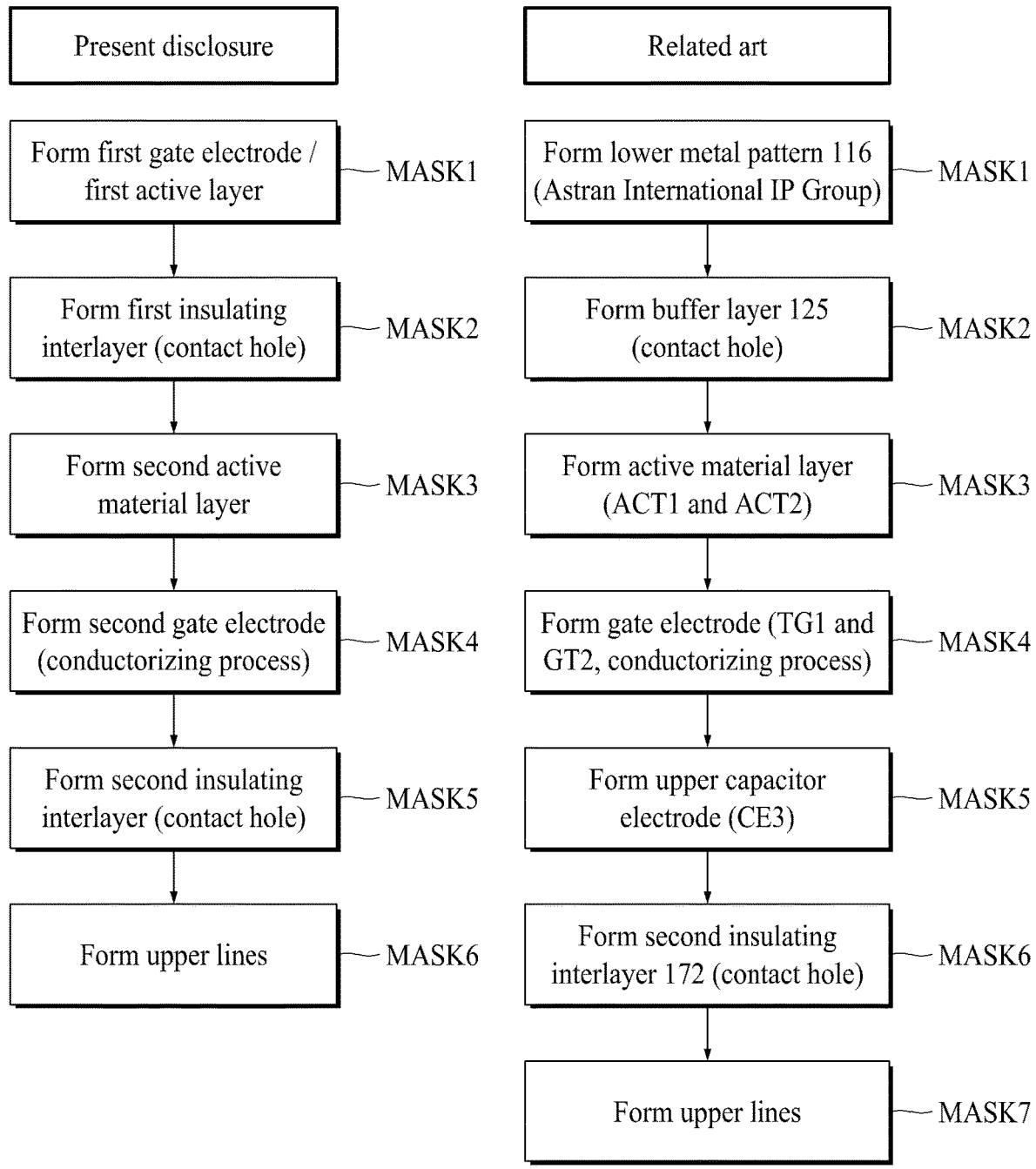
FIG. 11 is a diagram which compares a process for manufacturing a display apparatus according to one aspect of the present disclosure with a process for manufacturing a display apparatus according to the related art.

FIG. 11 is a diagram which compares a process for manufacturing a display apparatus according to one aspect of the present disclosure with a process for manufacturing a display apparatus according to the related art.

In detail, FIG. 11 compares the number of mask processes carried out until the pixel driving circuit (PDC) is completed in the display apparatus according to the display apparatus according to one aspect of the present disclosure with the number of mask processes carried out until a pixel driving circuit is completed in the display apparatus according to the related art.

According to one aspect of the present disclosure, the six mask processes are needed so as to form the pixel driving circuit (PDC).

In detail, according to one aspect of the present disclosure, the first mask process (MASK1) is carried out so as to form the first gate electrode (G1) and the first active layer (A1), the second mask process (MASK2) is carried out so as to form the contact hole in the first insulating interlayer 171, the third mask process (MASK3) is carried out so as to form the second active material layer, and the fourth mask process (MASK4) is carried out so as to form the second gate electrode (G2). The conductivizing process for the second active material layer is carried out for the fourth mask process (MASK4). Also, the fifth mask process (MASK5) is carried out so as to form the contact hole in the second insulating interlayer 172, and the sixth mask process (MASK6) is carried out so as to form the upper lines such as the gate line (GL), the emission control line (EL), the driving voltage connection line (PLB) and the third capacitor electrode (CE3).

Meanwhile, seven mask processes are needed so as to form the pixel driving circuit (PDC) of the display apparatus according to the related art shown in FIGS. 6A and 6B.

In detail, according to the related art, the first mask process (MASK1) is carried out so as to form a lower metal pattern 116, the second mask process (MASK2) is carried out so as to form a contact hole in a buffer layer 125, the third mask process (MASK3) is carried out so as to form active material layers (ACT1, ACT2), and the fourth mask process (MASK4) is carried out so as to form gate electrodes (TG1, TG2). The conductivizing process for the active material layers (ACT1, ACT2) is carried out for the fourth mask process (MASK4). Also, the fifth mask process (MASK5) is carried out so as to form an upper capacitor electrode (CE3), the sixth mask process (MASK6) is carried out so as to form a contact hole in a second insulating interlayer 172, and the seventh mask process (MASK7) is carried out so as to form upper lines such as a gate line (GL), an emission control line (EL), a driving voltage connection line (PLB) and a third capacitor electrode (CE3).

The number of mask processes for forming the pixel driving circuit (PDC) according to one aspect of the present disclosure is smaller than the number of mask processes for forming the pixel diver having the similar structure according to the related art. As a result, according to the present disclosure, it is possible to simplify the manufacturing process, and also to reduce the manufacturing cost and time.

It will be apparent to those skilled in the art that the present disclosure described above is not limited by the above-described aspects and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

What is claimed is:

1. A display apparatus comprising:
   a substrate;
   a pixel driving circuit on the substrate; and
   a display unit connected with the pixel driving circuit,
   wherein the pixel driving circuit includes a first thin film transistor and a second thin film transistor,
   wherein the first thin film transistor includes,
   a first gate electrode on the substrate,
   a first active layer spaced apart from the first gate electrode and overlapping at least a part of the first gate electrode,
   a first source electrode connected with the first active layer; and
   a first drain electrode spaced apart from the first source electrode and connected with the first active layer, and
   wherein the second thin film transistor includes,
   a second active layer on the substrate,
   a second gate electrode spaced apart from the second active layer and partially overlapping at least a part of the second active layer,
   wherein the first gate electrode is disposed between the substrate and the first active layer, the second active layer is disposed between the substrate and the second gate electrode, and the first gate electrode and the second gate electrode are disposed at an opposite side with respect to the second active layer, and
   a first insulating interlayer on the first active layer,
   wherein the first source electrode and the first drain electrode are disposed on the first insulating interlayer and are connected with the first active layer through contact holes.

2. The display apparatus according to claim 1, wherein the second active layer is disposed at a same layer as the first source electrode and the first drain electrode.

3. The display apparatus according to claim 1, each of the first source electrode and the first drain electrode has a recess in the contact holes.

4. The display apparatus according to claim 1, each of the first source electrode and the first drain electrode directly contacts the first active layer through the contact holes.

5. The display apparatus according to claim 1, further comprising an etch stopper on the first active layer, wherein the etch stopper is disposed at a same layer as the first insulating interlayer and is formed of a same material as the first insulating interlayer.

6. The display apparatus according to claim 1, wherein the second active layer is disposed on the first insulating interlayer.

7. The display apparatus according to claim 1, wherein the second active layer, the first source electrode and the first drain electrode are formed of an oxide semiconductor material.

8. The display apparatus according to claim 1, wherein at least one of the first active layer and the second active layer includes:
   a first oxide semiconductor layer; and
   a second oxide semiconductor layer disposed on the first oxide semiconductor layer.

9. The display apparatus according to claim 1, further comprising a data line and a driving voltage line,
   wherein the data line and the driving voltage line are disposed at a same layer as the first gate electrode.

10. The display apparatus according to claim 1, further comprising:
    a second insulating interlayer on the first source electrode and the first drain electrode; and
    a planarization layer on the second insulating interlayer,
    wherein the display unit is disposed on the planarization layer.

11. The display apparatus according to claim 10, further comprising a storage capacitor connected with the first thin film transistor,
    wherein the storage capacitor includes:
    a first capacitor electrode formed as one body with the first source electrode; and
    a second capacitor electrode formed as one body with the first gate electrode.

12. The display apparatus according to claim 11, wherein the storage capacitor further includes a third capacitor electrode spaced from the first capacitor electrode and disposed on the second insulating interlayer.

13. The display apparatus according to claim 1, wherein the first thin film transistor functions as a driving transistor that drives the display unit.

14. The display apparatus according to claim 1, wherein the second thin film transistor functions as a switching transistor.

* * * * *